(12) United States Patent  
Arai et al.

(10) Patent No.: US 8,546,223 B2  
(45) Date of Patent: Oct. 1, 2013

(54) SEMICONDUCTOR DEVICE AND MANUFACTURING METHOD OF THE SAME

(75) Inventors: Hiroki Arai, Tokyo (JP); Nobuyuki Shirai, Tokyo (JP); Tsuyoshi Kachi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 534 days.

(21) Appl. No.: 12/889,343

(22) Filed: Sep. 23, 2010

(65) Prior Publication Data

US 2011/0014761 A1    Jan. 20, 2011

Related U.S. Application Data

(62) Division of application No. 12/132,610, filed on Jun. 4, 2008, now Pat. No. 7,825,480.

(30) Foreign Application Priority Data

Jul. 3, 2007   (JP) .................................. 2007-175114

(51) Int. Cl.  
*H01L 21/336*   (2006.01)

(52) U.S. Cl.  
USPC ........... 438/284; 438/286; 257/287; 257/341; 257/401; 257/173; 257/325; 257/355

(58) Field of Classification Search  
USPC ................. 257/287, 341, 401, 173, 325, 355; 438/284, 286  
See application file for complete search history.

(56) References Cited

U.S. PATENT DOCUMENTS

| 6,888,206 | B2 | 5/2005 | Takahashi et al. |
| 7,172,941 | B2 | 2/2007 | Inagawa et al. |
| 2005/0029584 | A1 | 2/2005 | Shiraishi et al. |

FOREIGN PATENT DOCUMENTS

| JP | 2003-347547 A | 12/2003 |
| JP | 2005-057050 A | 3/2005 |

OTHER PUBLICATIONS

Japanese Office Action dated Nov. 13, 2013, issued in counterpart Japanese Patent Application No. 2007-175114.  
S.M. Sze, "Semiconductor Devices: Physics and Technology," $2^{nd}$ Edition, p. 187, subchapter 6.2.1, line 7. (C) Wiley and Sons, 2002.

*Primary Examiner* — Yu-Hsi D Sun  
(74) *Attorney, Agent, or Firm* — Miles & Stockbridge P.C.

(57) ABSTRACT

The characteristics of a semiconductor device including a trench-gate power MISFET are improved. The semiconductor device includes a substrate having an active region where the power MISFET is provided and an outer circumferential region which is located circumferentially outside the active region and where a breakdown resistant structure is provided, a pattern formed of a conductive film provided over the substrate in the outer circumferential region with an insulating film interposed therebetween, another pattern isolated from the pattern, and a gate electrode terminal electrically coupled to the gate electrodes of the power MISFET and provided in a layer over the conductive film. The conductive film of the pattern is electrically coupled to the gate electrode terminal, while the conductive film of another pattern is electrically decoupled from the gate electrode terminal.

2 Claims, 27 Drawing Sheets

SEMICONDUCTOR DEVICE AND MANUFACTURING METHOD OF THE SAME

CROSS-REFERENCE TO RELATED APPLICATIONS

This application is a division of application Ser. No. 12/132,610 filed Jun. 4, 2008 (now U.S. Pat. No. 7,825,480). The disclosure of Japanese Patent Application No. 2007-175114 filed on Jul. 3, 2007 including the specification, drawings and abstract is incorporated herein by reference in its entirety.

BACKGROUND OF THE INVENTION

The present invention relates to a semiconductor device and a technology for manufacturing the same and, more particularly, to a technology which is effective when applied to a semiconductor device having a power semiconductor element.

A semiconductor element for large-power applications which can handle a power of not less than several watts is referred to as a power semiconductor element. Various power semiconductor elements have been proposed, including a transistor, a FET (Field Effect Transistor), an IGBT (Insulated Gate Bipolar Transistor), and the like. Among such power semiconductor elements, power MIS (Metal Insulator Semiconductor) FETs include a so-called vertical type and a so-called horizontal type, and are further classified into structures such as a trench-gate structure and a planar-gate structure according to the structures of their gate portions. To obtain a large power, a structure has been adopted in which, e.g., a large number of (e.g., several tens of thousands of) MISFETs in a minute pattern are coupled in parallel.

Power MISFETs are used as switching elements for DC/DC converters used in the power supply circuits of various computers such as, e.g., a desktop computer, a notebook computer, and a server. Of a DC/DC converter, reductions in the capacitances of a choke coil, an input/output, and the like and a high-speed response to a load variation are required. When a system becomes higher in frequency, a switching loss and a drive loss typically increase in a power MISFET. Because the switching loss is directly proportional to the feedback capacitance of the power MISFET and the drive loss is directly proportional to the input capacitance of the power MISFET, reductions in these capacitances are required of the power MISFET used in the DC/DC converter.

FIG. 27 shows an equivalent circuit diagram for illustrating the feedback capacitance and the input capacitance. As shown in FIG. 27, when it is assumed that Cgd represents a gate-drain capacitance, Cgs represents a gate-source capacitance, and a Cds represents a drain-source capacitance, the input capacitance Cin of the power MISFET (Q) can be expressed as Cin=Cgd+Cgs, and the feedback capacitance Cfb can be expressed as Cfb=Cgd.

Based on the result of the achieved invention, the present inventors have conducted a research on prior-art technologies in terms of element characteristics such as a lower capacitance of a power semiconductor element and a reduction in manufacturing cost. As a result of conducting the research in terms of the lower capacitance, the present inventors have extracted Japanese Unexamined Patent Publication No. 2005-57050 (Patent Document 1). The technology disclosed in Patent Document 1 generally achieves a lower capacitance with a gate peripheral structure in an active region where a power MISFET is formed, but has no description of a characteristic improvement in the outer circumferential region of the active region and a reduction in manufacturing cost.

[Patent Document 1]
Japanese Unexamined Patent Publication No. 2005-57050

SUMMARY OF THE INVENTION

The present inventors have examined a semiconductor device comprising a power semiconductor element. A manufacturing method of the semiconductor device comprising the n-channel trench-gate power MISFET examined by the present inventors will be described sequentially using FIGS. to 4. FIGS. 1 to 4 are cross-sectional views each schematically showing the principal portion of the semiconductor device in the manufacturing process thereof, which has been examined by the present inventors. In the drawings, the reference mark A indicates an active region where the power MISFET is provided in a plane surface region of a semiconductor substrate 1, and the reference mark B indicates an outer circumferential region which is located circumferentially outside the active region and where a breakdown resistant structure is provided.

The outline of the process prior to the step shown in FIG. 1 is as follows. First, a semiconductor substrate (hereinafter simply referred to as the substrate) is prepared by forming an n$^-$-type single-crystal silicon layer 1B over the principal surface of an n$^+$-type single-crystal silicon substrate 1A. Next, an insulating film 2, e.g., is formed on the n$^-$-type single-crystal silicon layer 1B. Then, a p$^-$-type semiconductor region 3 is formed in the surface side of the n$^-$-type single-crystal silicon layer 1B. Next, etching is performed with respect to the insulating film 2 and the substrate 1 to form trenches 4. Thereafter, gate insulating films 5 are formed on the respective bottom portions and sidewalls of the trenches 4. Next, a conductive film 7 is deposited on the insulating film 2 including the insides of the trenches 4.

Subsequently, as shown in FIG. 2, etching is performed with respective to the conductive film 7 using a photoresist film (not shown) patterned using a photolithographic technique so as to leave the conductive film 7 on the insulating film 2. By also leaving the conductive film 7 in each of the trenches 4, the gate electrodes 6 of the power MISFET are formed in the trenches 4. The remaining portions of the etched conductive film 7 are connected to the gate electrodes 6 of the power MISFET in a region not shown. In forming the patterned photoresist film, a single photomask is used.

Subsequently, as shown in FIG. 3, the unneeded portion of the insulating film 2 is etched (removed) using a photoresist film (not shown) patterned using a photolithographic technique. In forming the patterned photoresist film, a single photomask is used.

Subsequently, using a photoresist film (not shown) patterned using a photolithographic technique as a mask, impurity ions having a p-type conductivity are introduced (ion implantation) into the n$^-$-type single-crystal silicon layer 1B and diffused by performing a thermal process with respect to the substrate 1, thereby forming a p$^-$-type semiconductor region 8 (see FIG. 4). In forming the patterned photoresist film, a single photomask is used.

Thereafter, by the process outlined hereinbelow, a semiconductor device as shown in FIG. 4 is completed. First, in a p$^-$-type semiconductor region 9, an n$^+$-type semiconductor region 11 is formed. Next, an insulating film 12 is formed on the substrate 1. Then, etching is performed with respect to the insulating film 12 and the substrate 1 to form contact trenches 13, while also patterning the insulating film 12 on the conductive film 7 to form a contact trench 14 reaching the conductive film 7. Next, p$^+$-type semiconductor regions 15 covering the bottom portions of the contact trenches 13 are formed. Then, a metal film is deposited over the insulating film 12 including the insides of the contact trenches 13 and and patterned to form a gate electrode terminal 16 electrically coupled to the gate electrodes 6, a source electrode terminal 17 electrically coupled to the n$^+$-type semiconductor region 11, and an outermost circumferential electrode terminal 18 electrically coupled to the substrate 1. Next, a polyimide resin film covering the principal surface of the substrate 1 is formed, while a drain electrode terminal (not shown) electrically coupled to the n$^+$-type single-crystal silicon substrate 1A is formed on the back surface of the substrate 1.

However, further characteristic improvements are desired by elaborating the structure of the semiconductor device.

It is also necessary to reduce manufacturing cost by, e.g., reducing the number of photomasks used in photolithographic steps or the like.

An object of the present invention is to provide a technology which allows improvements in the characteristics of a semiconductor device.

Another object of the present invention is to provide a technology which allows a reduction in the manufacturing cost of the semiconductor device.

The above and other objects and novel features of the present invention will become apparent from the description of the present specification and the accompanying drawings.

As shown below, a brief description will be given of the outline of a representative aspect of the invention disclosed in the present application.

In an embodiment of the present invention, there is shown a semiconductor device including a semiconductor substrate having an active region where a power MISFET is provided and an outer circumferential region which is located circumferentially outside the active region and where a breakdown resistant structure is provided, a first pattern formed of a conductive polysilicon film provided over the semiconductor substrate in the outer circumferential region with an insulating film interposed therebetween, a second pattern isolated from the first pattern, and a gate electrode terminal electrically coupled to the gate of the power MISFET and provided in a layer over the polysilicon film. In the semiconductor device, the polysilicon film of the first pattern is electrically coupled to the gate electrode terminal, while the polysilicon film of the second pattern is electrically decoupled from the gate electrode terminal.

The following is a brief description of an effect achievable by the representative aspect of the invention disclosed in the present application.

According to the embodiment, it is possible to prevent, in the step of introducing an impurity into the semiconductor substrate, the introduction of the unneeded impurity into the semiconductor substrate under the first pattern and the second pattern, and improve the characteristics of the semiconductor device.

DETAILED DESCRIPTION OF THE PREFERRED EMBODIMENTS

Figure 1:
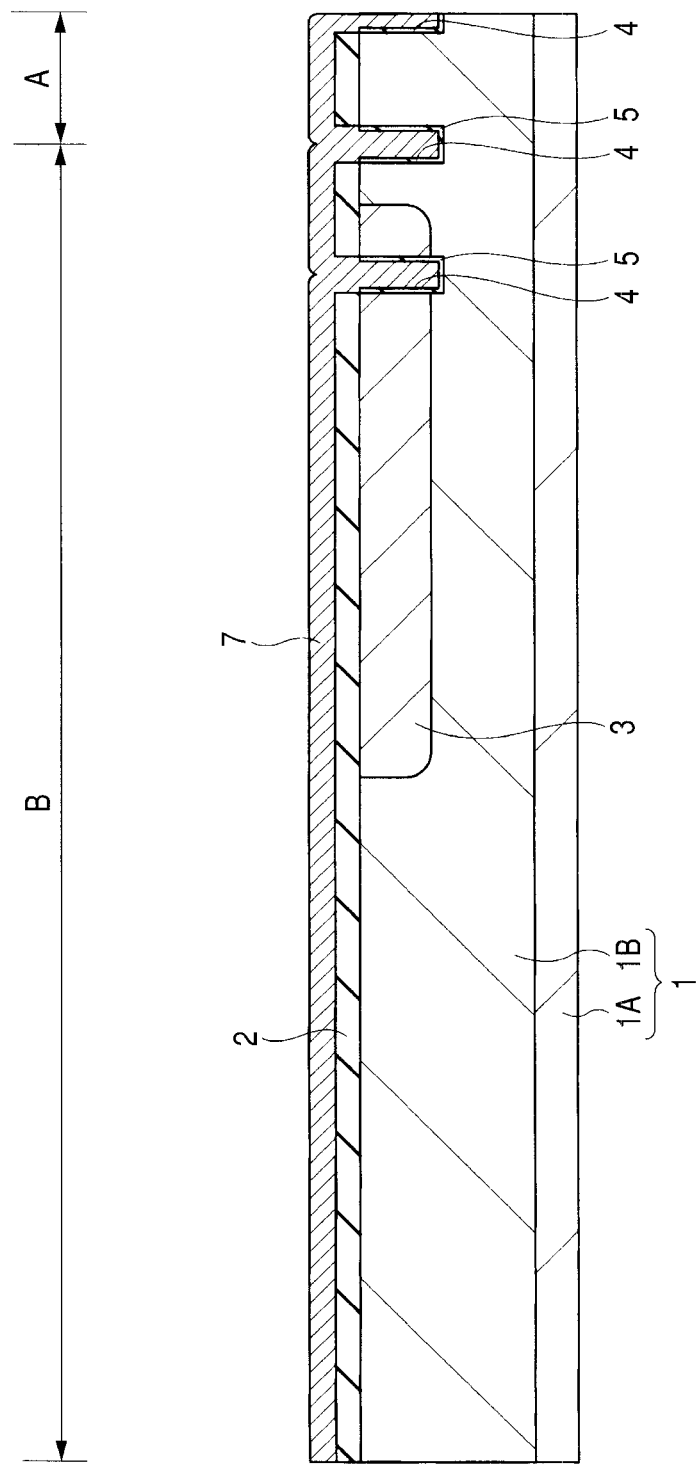
FIG. 1 is a cross-sectional view of a principal portion of a semiconductor device in the manufacturing process thereof, which has been examined by the present inventors.
Figure 2:
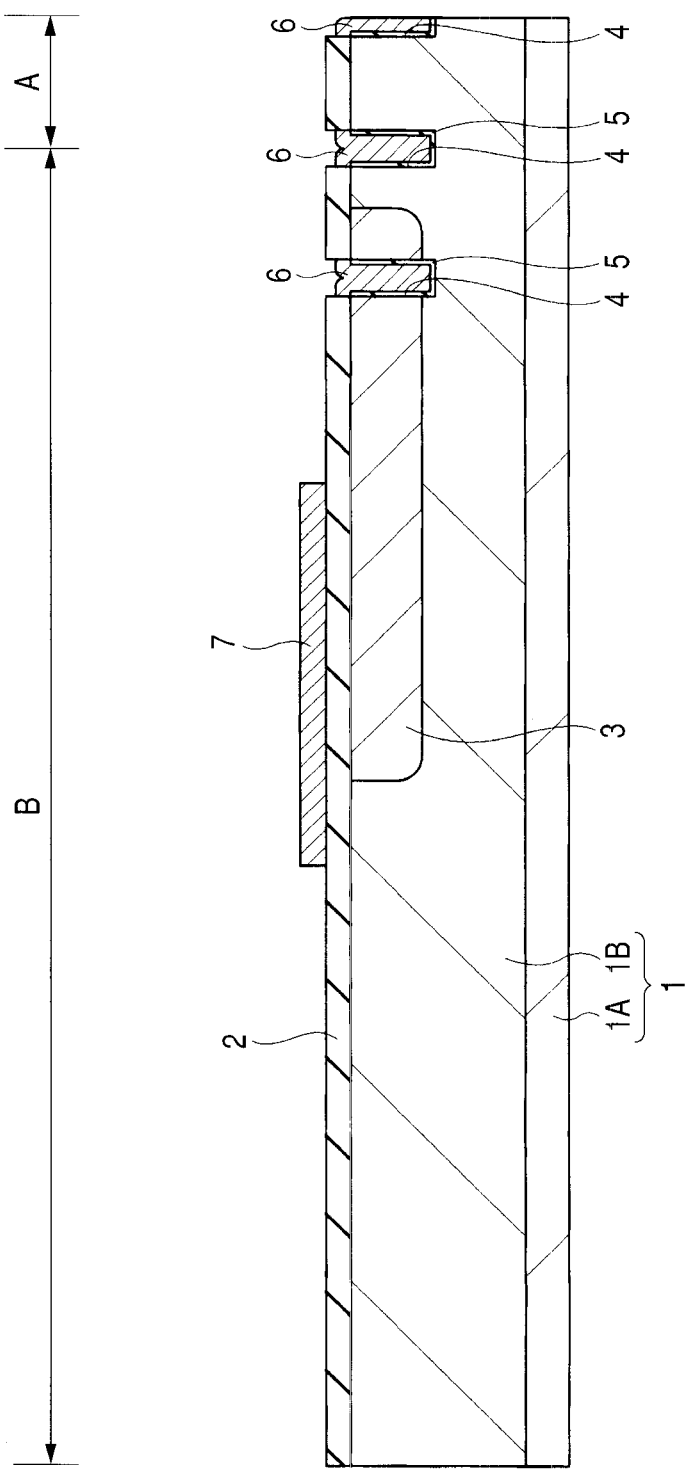
FIG. 2 is a cross-sectional view of the principal portion of the semiconductor device in the manufacturing process thereof, subsequent to FIG. 1.
Figure 3:
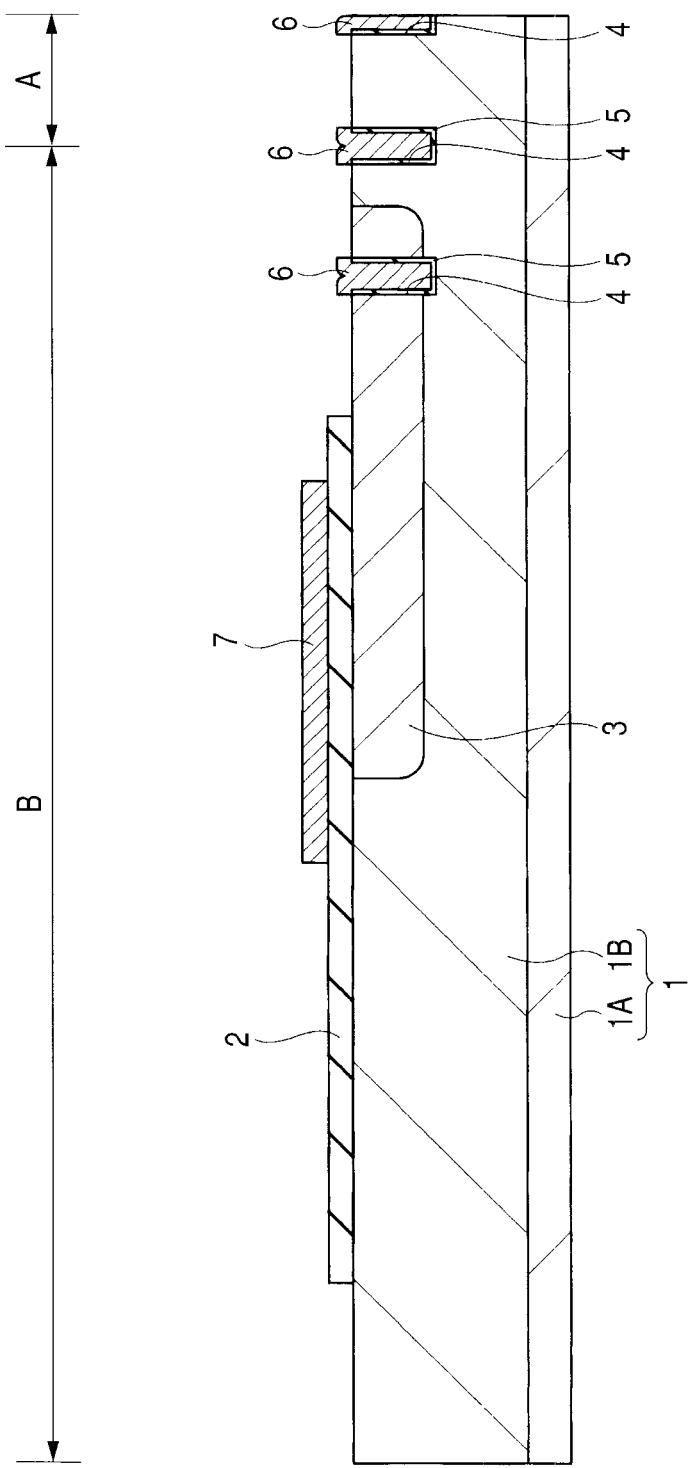
FIG. 3 is a cross-sectional view of the principal portion of the semiconductor device in the manufacturing process thereof, subsequent to FIG. 2.

Referring to the drawings, the embodiments of the present invention will be described hereinbelow in detail. Throughout all the drawings for illustrating the embodiments, members having like functions are provided with like reference numerals and a repeated description thereof may be omitted. In the drawings illustrating the following embodiments, even plan views may be hatched for clear illustration of a structure.

(Embodiment 1)

A semiconductor device according to the present first embodiment has an n-channel trench-gate power MISFET (semiconductor element). Accordingly, a current flowing in a drain region as a drift region is controlled by a trench gate.

A manufacturing method of the semiconductor device according to the present first embodiment will be described with reference to FIGS. 5 to 12. FIGS. 5 to 11 are cross-sectional views schematically showing the principal portion of the semiconductor device comprising the power MISFET according to the present first embodiment in the manufacturing process thereof. FIG. 12 is a flow chart of the manufacturing of the semiconductor device. In the drawings, the reference mark A denotes an active region (first region) where the power MISFET is provided in the plane region of a semiconductor substrate 1, and the reference mark B denotes an outer circumferential region (second region) which is located circumferentially outside the active region and where a breakdown resistant structure is provided.

Figure 5:
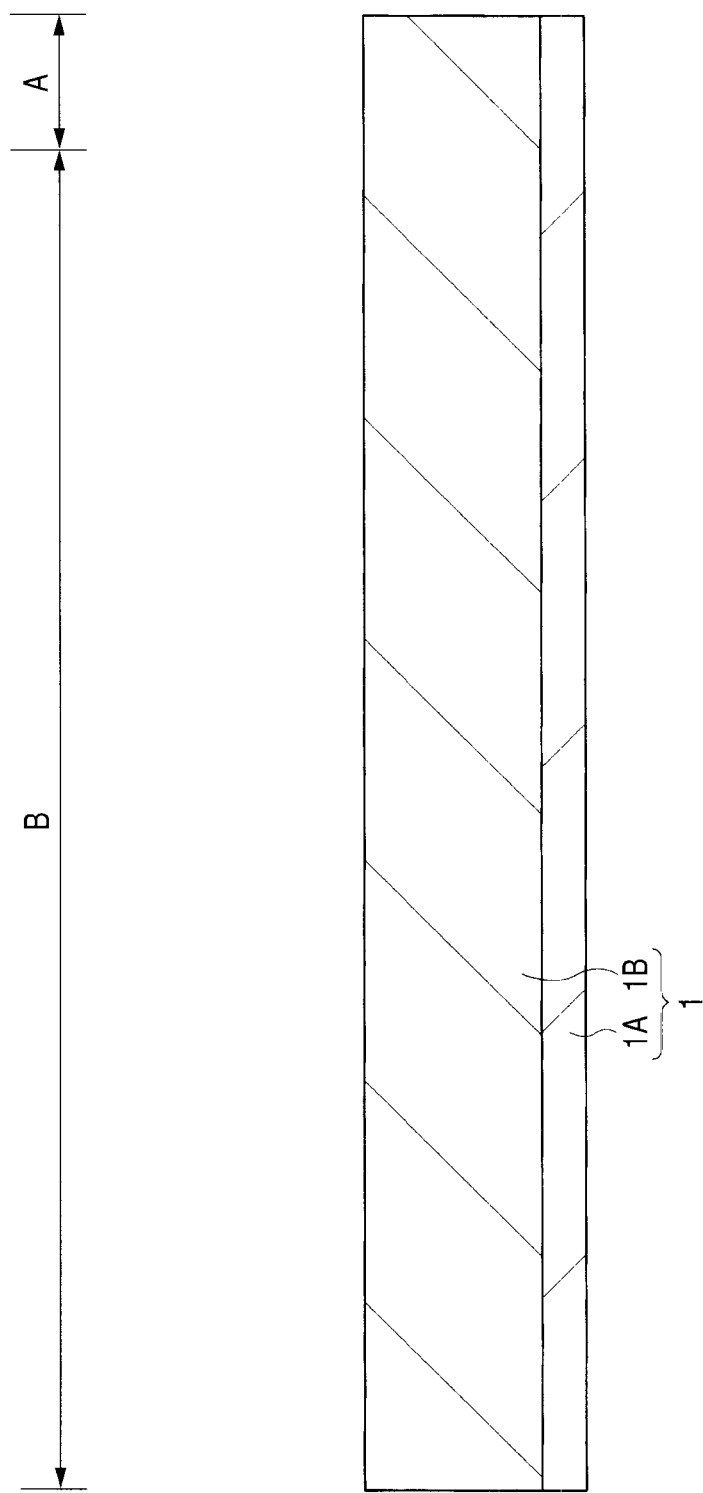
FIG. 5 is a cross-sectional view of the principal portion of the semiconductor device in the manufacturing process thereof, which has been examined by the present inventors.

First, as shown in FIG. 5, an n-type semiconductor region (first semiconductor region) composing the drift region of the power MISFET is formed on the principal surface of a semiconductor substrate 1A having the active region A where the power MISFET is provided and the outer circumferential region B which is located circumferentially outside the active region A and where a breakdown resistant structure is provided (Step S10). For example, an n$^-$-type single-crystal silicon layer (first semiconductor region) 1B doped with an impurity having an n-type conductivity (e.g., P (phosphorus)) at about $1 \times 10^{16}$/cm$^3$ is epitaxially grown on the principal surface (element formation surface) of the n$^+$-type single-crystal silicon substrate (semiconductor substrate) 1A having the n-type conductivity at about $1 \times 10^{19}$/cm$^3$. The substrate 1 as a combination of the n$^+$-type single-crystal silicon substrate 1A and the n$^-$-type single-crystal silicon layer 1B is also referred to as a semiconductor substrate. The n$^-$-type single-crystal silicon layer 1B serves as the drift region of the power MISFET.

Figure 6:
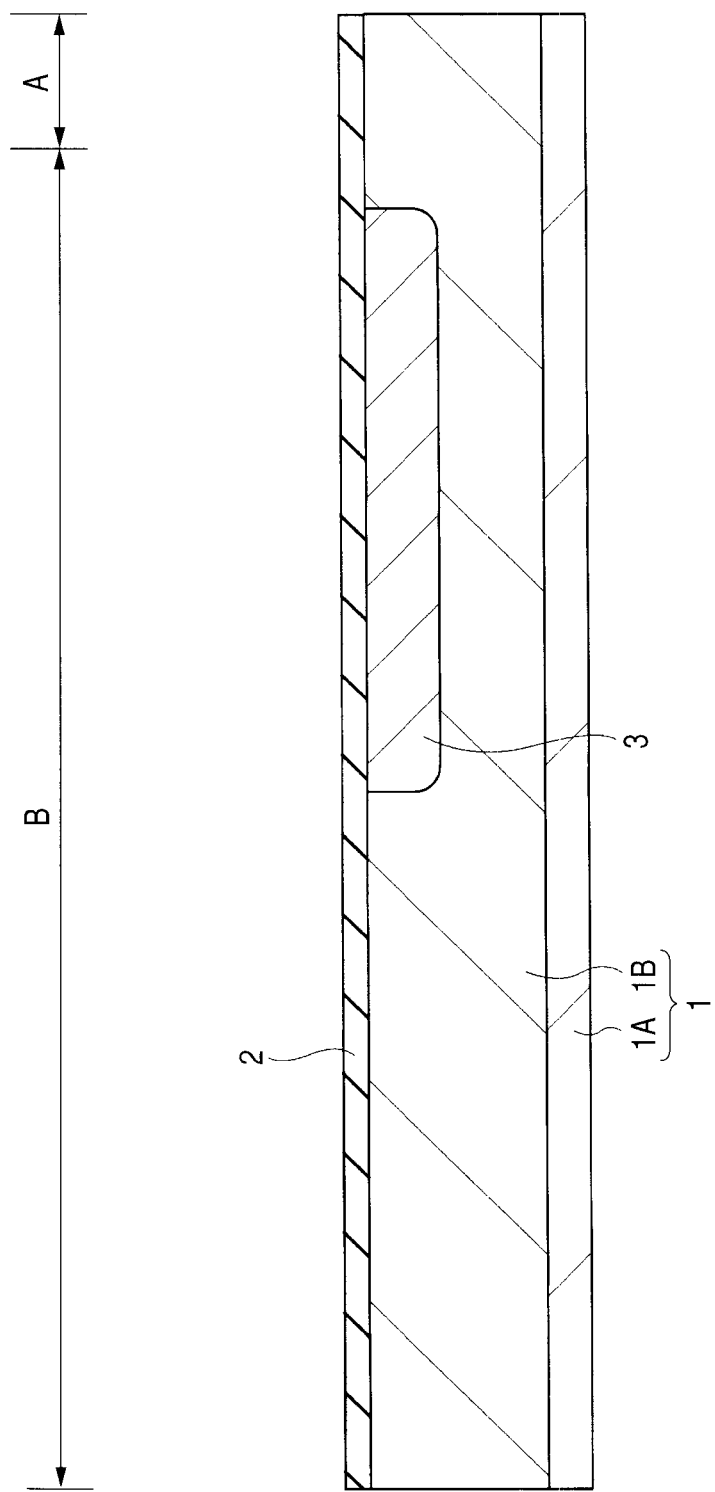
FIG. 6 is a cross-sectional view of a principal portion of a semiconductor device according to a first embodiment of the present invention in the manufacturing process thereof.

Subsequently, as shown in FIG. 6, an insulating film 2 is formed on the substrate 1 (Step S20). For example, the insulating film 2 is formed of a silicon oxide film (field oxide film) with a thickness of 250 nm to 400 nm obtained by thermally oxidizing the surface of the n$^-$-type single-crystal silicon layer 1B.

Subsequently, a p$^-$-type semiconductor region (second semiconductor region) 3 having a p-type conductivity opposite to the n-type conductivity of the n$^-$-type single-crystal silicon layer 1B is formed in the surface side of the n$^-$-type single-crystal silicon layer 1B in the outer circumferential region (Step S30). The p$^-$-type semiconductor region 3 is formed by, e.g., implanting an impurity having the p-type conductivity (e.g., B (boron)) using a silicon nitride film (not shown) patterned using a photolithographic technique or the like over the insulating film 2 and thermally diffusing the implanted impurity. The impurity concentration of the p$^-$-type semiconductor region 3 can be set to a value in the range of, e.g., $1 \times 10^{16}$/cm$^3$ to $1 \times 10^{17}$/cm$^3$.

Figure 7:
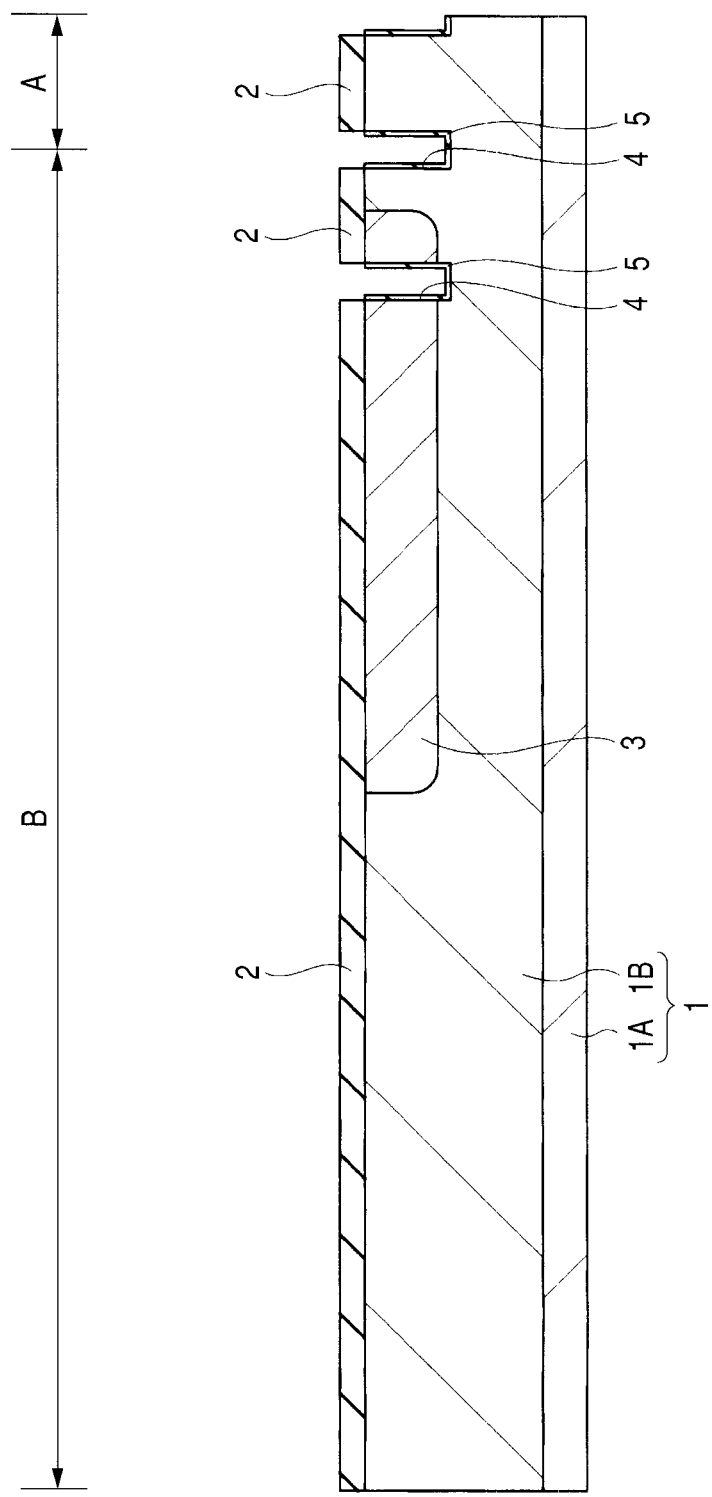
FIG. 7 is a cross-sectional view of the principal portion of the semiconductor device in the manufacturing process thereof, subsequent to FIG. 6.

Subsequently, as shown in FIG. 7, a plurality of trenches 4 are formed in the surface side of the n$^-$-type single-crystal silicon layer 1B in the active region A (Step S40). For example, etching is performed with respect to the insulating film 2 and the substrate 1 using a photoresist film (not shown) patterned using a photolithographic technique as a mask to form the trenches 4.

Subsequently, gate insulating films 5 for the power MISFET are formed in the respective trenches 4 (Step S50). For example, the gate insulating films 5 each having a thickness of 50 nm to 200 nm are formed of thermal oxide films formed on the respective bottom portions and sidewalls of the trenches 4 by performing a thermal process with respect to the substrate 1.

Subsequently, a conductive film 7 is formed on the insulating film 2 to fill up the trenches 4 (Step S60). For example, the conductive film 7 is formed of a polysilicon film with a thickness of 100 nm to 500 nm deposited using a CVD (Chemical Vapor Deposition) method and doped with phosphorus. Then, etching is performed with respect to the conductive film 7 and the insulating film 2 using a photoresist film (not shown) patterned using a photolithographic technique as a mask to remove the unneeded portions of the conductive film 7 and the insulating film 2 (Step S70).

Figure 8:
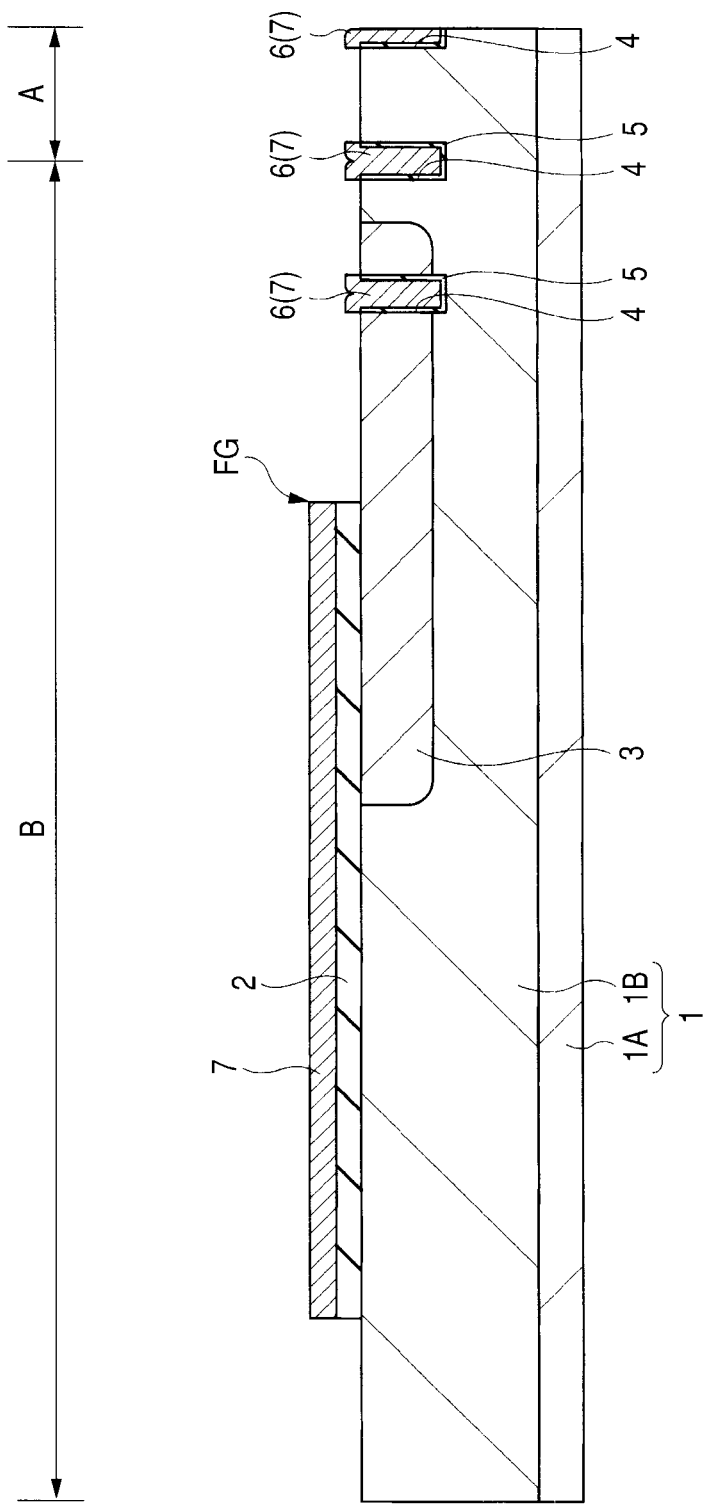
FIG. 8 is a cross-sectional view of the principal portion of the semiconductor device in the manufacturing process thereof, subsequent to FIG. 7.

At this time, as shown in FIG. 8, gate electrodes 6 each as the trench gate of the power MISFET are formed in the trenches 4 by leaving the conductive film 7 in the trenches 4. The conductive film 7 is also left on the insulating film 2 in the outer circumferential region B. It is to be noted herein that the conductive film 7 composing the gate electrodes 6 and the conductive film 7 on the insulating film 2 are electrically coupled in a region not shown. That is, the predetermined portion of the n$^-$-type single-crystal silicon layer 1B in the active region A and the predetermined portion of the n$^-$-type single-crystal silicon layer 1B in the outer circumferential region B are exposed by patterning the conductive film 7 and the insulating film 2. In the outer circumferential region B, a pattern FG formed of the conductive film 7 is formed on the n$^-$-type single-crystal silicon layer 1B including the space above the p$^-$-type semiconductor region 3 with the insulating film 2 interposed therebetween. The conductive film 7 thus composing the pattern FG and the gate electrodes 6 are formed of the same material.

Figure 9:
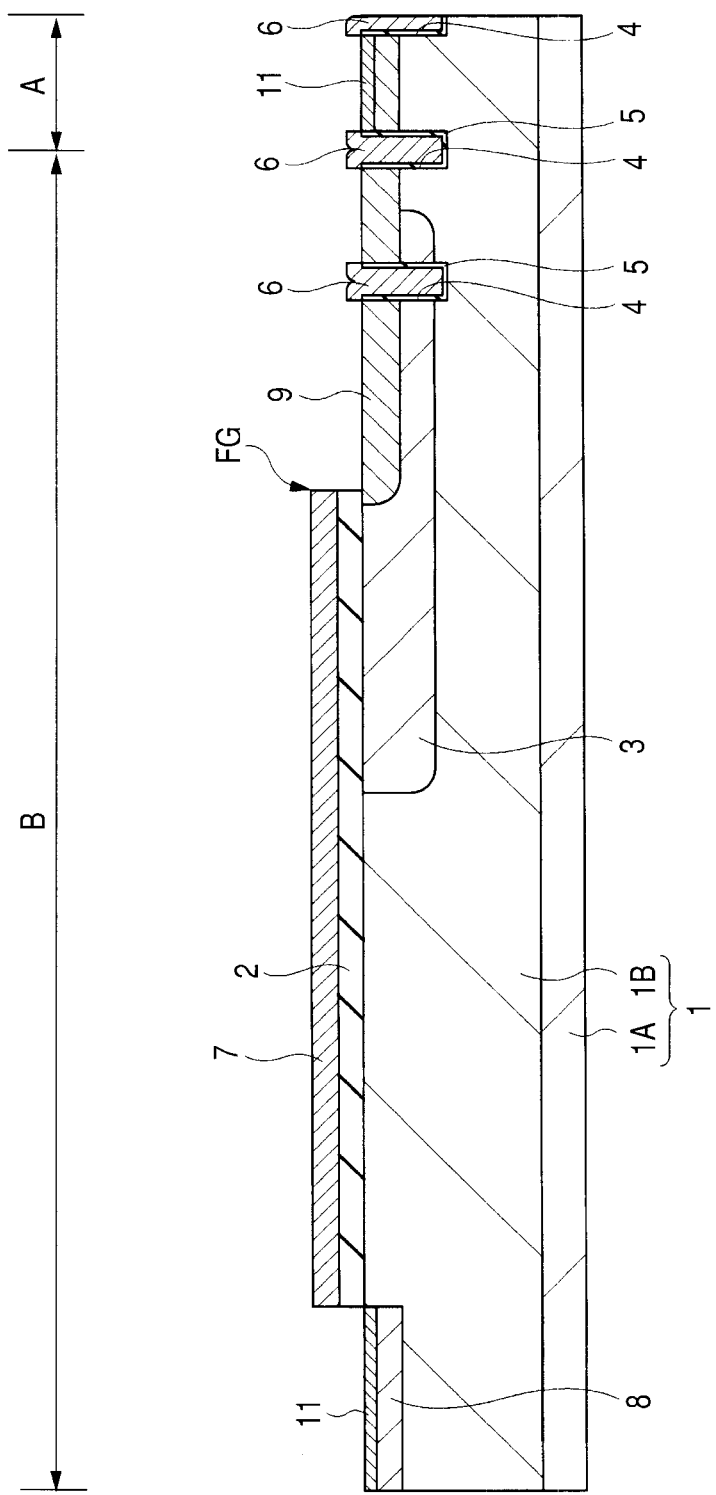
FIG. 9 is a cross-sectional view of the principal portion of the semiconductor device in the manufacturing process thereof, subsequent to FIG. 8.

Subsequently, as shown in FIG. 9, a p$^-$-type semiconductor region (third semiconductor region) 8 having the p-type conductivity is formed in the surface side of the n$^-$-type single-crystal silicon layer 1B on the outermost circumferential side of the outer circumferential region B in isolated relation to the p$^-$-type semiconductor region 3 (Step S80). In addition, p$^-$-type semiconductor regions (fourth semiconductor regions) 9 are formed by introducing a p-type impurity into the principal surface of the substrate 1 (Step S90). For example, a silicon oxide film (not shown) is deposited as a protective film on the substrate 1. Then, impurity (e.g., B (boron)) ions having the p-type conductivity are introduced (ion implantation) into the n$^-$-type single-crystal silicon layer 1B using the pattern FG formed of the conductive film 7 as a mask, and diffused by performing a thermal process with respect to the substrate 1. As a result, the p$^-$-type semiconductor region 8 and the p$^-$-type semiconductor regions 9 are formed simultaneously. The impurity concentrations of the p$^-$-type semiconductor regions 9 forming the channel layer can be set to values in the range of, e.g., $5 \times 10^{16}$/cm$^3$ to $5 \times 10^{17}$/cm$^3$.

An n$^+$-type semiconductor region 11 forms a channel stopper serving as the terminal end of a depletion layer that has expanded in the outer circumferential region B where a breakdown resistant structure is provided. The p⁻-type semiconductor regions 9 form the channel layer of the power MISFET after the formation of the power MISFET.

Subsequently, an n-type impurity is introduced into the principal surface of the substrate 1 so as to form the n⁺-type semiconductor region (fifth semiconductor region) 11 in the surface of the p⁻-type semiconductor region 9 in the active region A (Step S100). For example, impurity (e.g., As (arsenide)) ions having the n-type conductivity are introduced (ion implantation) into the n⁻-type single-crystal silicon layer 1B using a photoresist film (not shown) patterned using a photolithographic technique as a mask, and diffused by performing a thermal process with respect to the substrate 1 to form the n⁺-type semiconductor region 11 in the surface side of the p⁻-type semiconductor region 9. It is also possible to simultaneously form the n⁺-type semiconductor region 11 in the surface side of the p⁻-type semiconductor region 8 in the outer circumferential region B. The n⁺-type semiconductor region 11 forms the source region of the power MISFET. The impurity concentration of the n⁺-type semiconductor region 11 forming the source region can be set to a value of not less than $1 \times 10^{19}/\text{cm}^3$.

Figure 10:
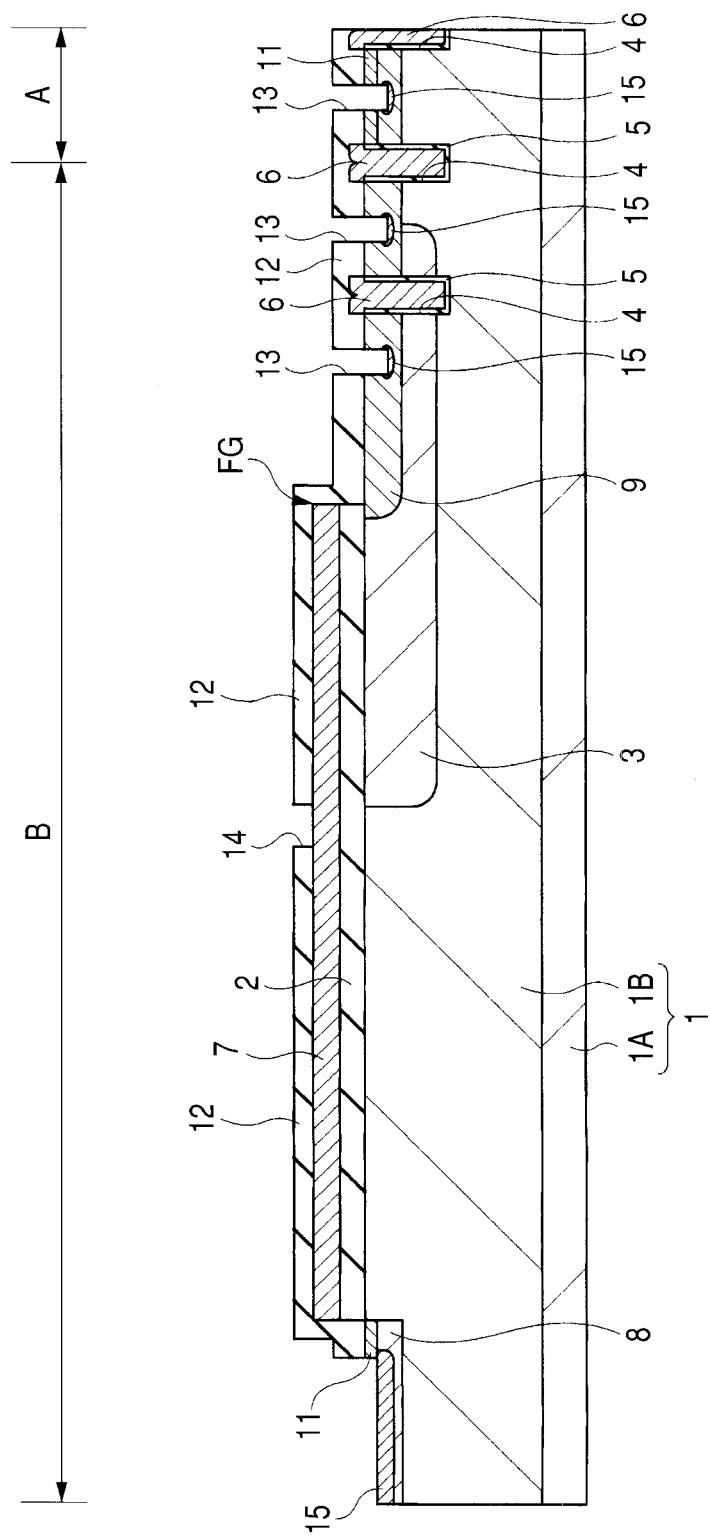
FIG. 10 is a cross-sectional view of the principal portion of the semiconductor device in the manufacturing process thereof, subsequent to FIG. 9.

Subsequently, as shown in FIG. 10, a PSG (Phospho Silicate Glass) film, e.g., is deposited on the substrate, and then a SOG (Spin On Glass) film is coated on the PSG film to form an insulating film 12 formed of the PSG film and the SOG film and having a thickness of 150 nm to 600 nm.

Subsequently, contact trenches (shallow trenches) 13 extending through the n⁺-type semiconductor region 11 and shallower than the trenches 4 in which the gate electrodes 6 are formed are formed in the surface side of the p⁻-type semiconductor region 9 to be provided between the adjacent gate electrodes 6 (trench gates) (Step S110). For example, etching is performed with respect to the insulating film 12 and the substrate 1 using a photoresist film (not shown) patterned using a photolithographic technique as a mask to form the contact trenches. At this time, the insulating film on the conductive film 7 is also patterned so that a contact trench 14 reaching the conductive film 7 is formed.

Subsequently, by introducing a p-type impurity into the principal surface of the substrate 1, p⁺-type semiconductor regions 15 each having the p-type conductivity are formed so as to cover the bottom portions of the contact trenches 13 in the p⁻-type semiconductor region 9. For example, by introducing (ion implantation) $BF_2$ (boron difluoride) as impurity ions having the p-type conductivity from the bottom portions of the contact trenches 13, the p⁺-type semiconductor regions (sixth semiconductor regions) 15 are formed so as to cover the respective bottom portions of the contact trenches 13 (Step S120). The p⁺-type semiconductor regions 15 form so-called back gates. The impurity concentrations of the p⁺-type semiconductor regions 15 forming the back gates can be set to values in the range of, e.g., $1 \times 10^{17}/\text{cm}^3$ to $1 \times 10^{18}/\text{cm}^3$.

By thus forming the contact trenches 13, introducing the impurity ions (ion implantation) from the contact trenches 13 using the insulating film 12 as a mask, and providing the p⁺-type semiconductor regions 15 at the respective bottom portions of the contact trenches 13 by self alignment, it is possible to reduce, e.g., an allowance for mask alignment and thereby significantly reduce the spaces between the adjacent gate electrodes 6. The p⁺-type semiconductor regions 15 bring wiring formed in the subsequent step into ohmic contact with the p⁻-type semiconductor region 8 at the bottom portions of the contact trenches 13.

Figure 11:
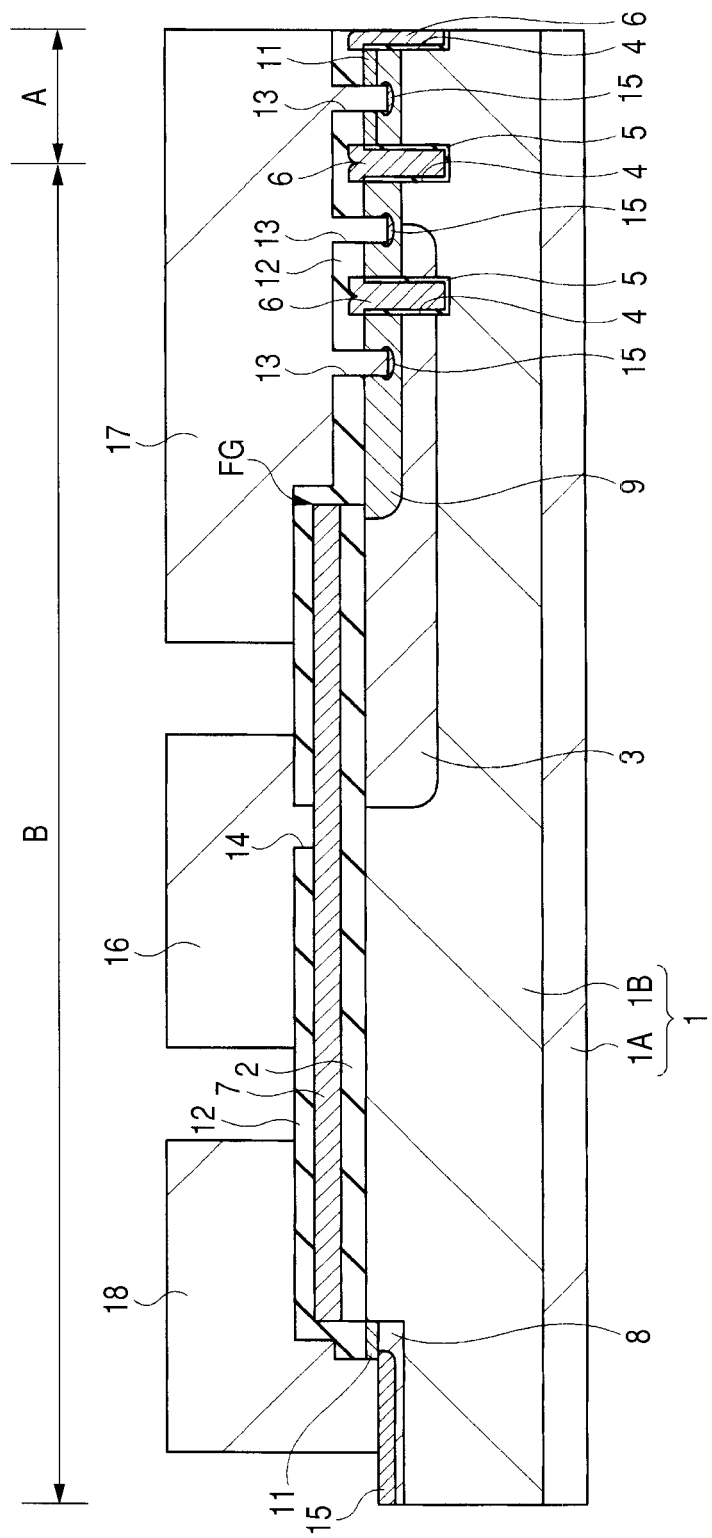
FIG. 11 is a cross-sectional view of the principal portion of the semiconductor device in the manufacturing process thereof, subsequent to FIG. 10.
Figure 12:
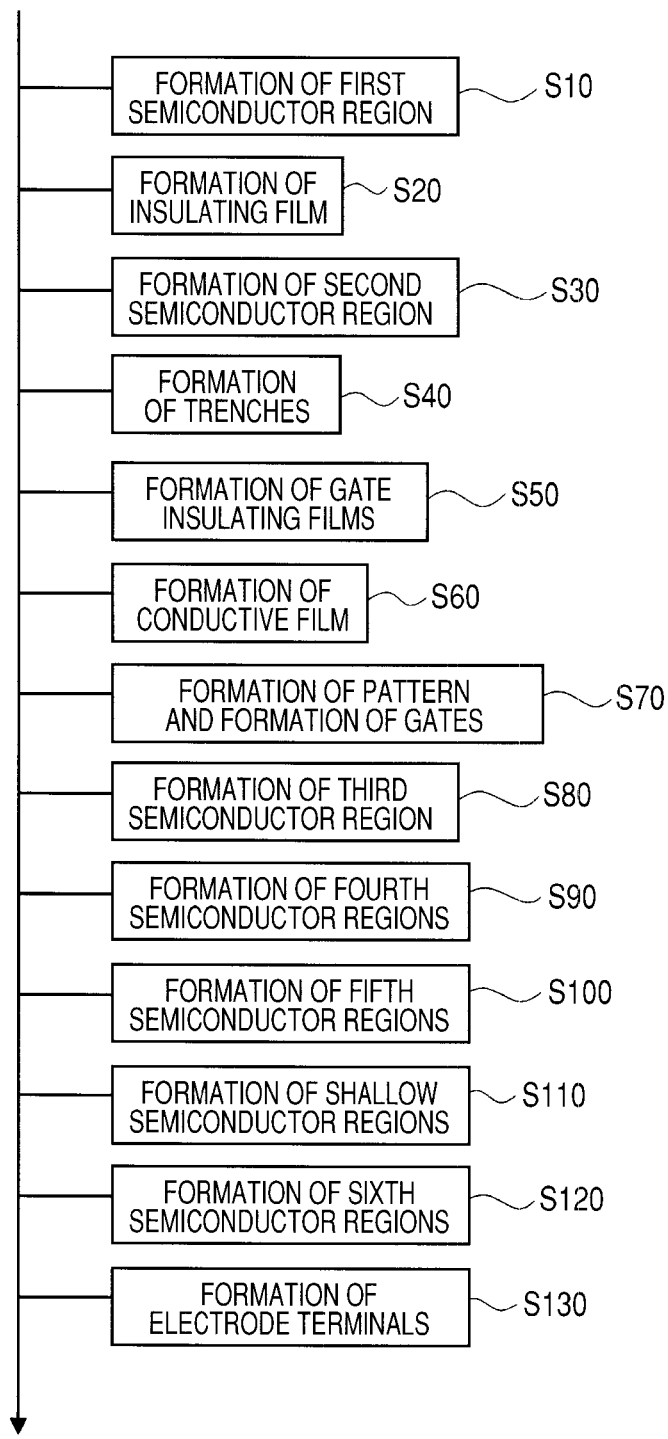
FIG. 12 is a flow chart of the manufacturing of the semiconductor device according to the first embodiment.

Subsequently, as shown in FIG. 11, a TiW (titanium-tungsten) film is deposited thin as a barrier conductor film over the insulating film 12 including the insides of the contact trenches 13 and 14 by, e.g., a sputtering method. Thereafter, a thermal process is performed with respect to the substrate 1. Then, an Al (aluminum) film lower in resistivity than the polysilicon film forming the gate electrodes 6 is deposited on the TiW film by, e.g., a sputtering method. The barrier conductor film functions to prevent the formation of an undesired reaction layer by contact between Al and the substrate (Si). In the present first embodiment, the Al film indicates a film containing Al as a main component, and may also contain another metal or the like.

Subsequently, etching is performed with respect to the TiW film and the Al film using, as a mask, a photoresist film (not shown) patterned using a photolithographic technique, thereby forming a gate electrode terminal 16 electrically coupled to the gate electrodes 6, a source electrode terminal 17 electrically coupled to the n⁺-type semiconductor regions 11 serving as the source region of the power MISFET, and an outermost circumferential electrode terminal 18 in the same layer (having a thickness of 2 μm to 6 μm) (Step S130).

By the steps performed heretofore, the power MISFET can be formed which has the gate electrodes 6 as the trench gates, the n⁺-type single-crystal silicon substrate 1A and the n⁻-type single-crystal silicon layer 1B as the drain region, and the n⁺-type semiconductor regions 11 as the source region.

Figure 13:
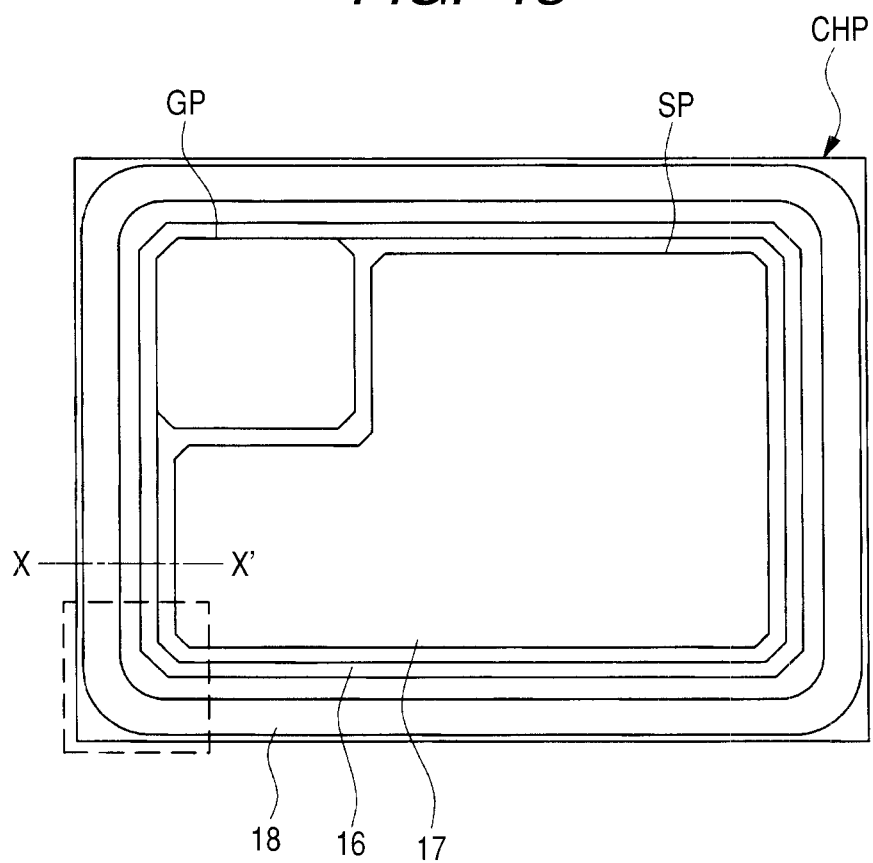
FIG. 13 is a plan view of the semiconductor device according to the first embodiment.

FIG. 13 schematically shows a plane surface of a rectangular semiconductor chip (hereinafter referred to as the chip) CHP having the substrate 1. In the drawing, the reference mark GP denotes a gate pad formed of the gate electrode terminal 16, and the reference mark SP denotes a source pad formed of the source electrode terminal 17. The external electrode terminal 18 is electrically coupled to the substrate 1 composing the chip CHP. In the drawing, the cross section along the line X-X' corresponds to the cross sections shown in FIGS. 5 to 11.

Figure 14:
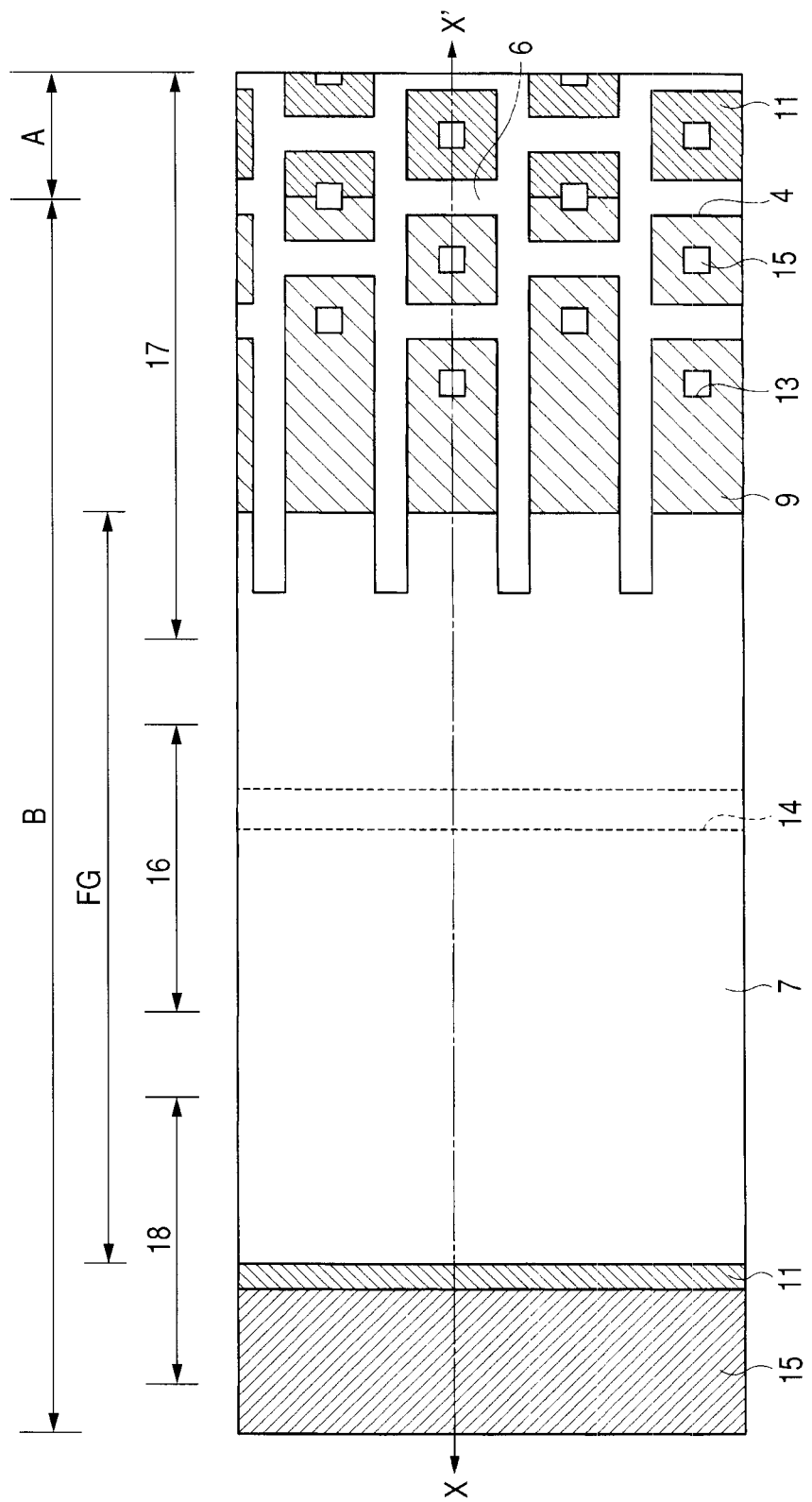
FIG. 14 is an enlarged plan view of the principal portion of FIG. 13.

FIG. 14 is an enlarged plan view of the principal portion of FIG. 13, which particularly distinctly shows the respective plan configurations of the pattern FG (conductive film 7) and the trenches 4 of the trench gates (gate electrodes 6). For clear illustration of the drawing, the gate electrode terminal 16, the source electrode terminal 17, the outermost circumferential electrode terminal 18, and the pattern FG in FIG. 14 are shown as respective regions where they are provided. The contact trench 14 provided in the insulating film 12 is indicated by the broken lines, though the insulating film 12 is not depicted. The cross section along the line X-X' in FIG. 14 corresponds to the cross sections shown in FIGS. 5 to 11.

As shown in FIG. 14, the trenches 4 of the trench gates 4 are provided in a net-like pattern in plan view. Although the trenches 4 are shown in the net-like pattern by way of example, the trenches 4 may also be provided in a striped pattern or the like, other than the net-like pattern. The pattern FG in the outer circumferential region B is provided on the outermost circumferential side of the chip CHP. Under the pattern FG, the n⁺-type semiconductor region 11 and the p⁺-type semiconductor region 15, which are formed in the impurity introduction steps, are not provided.

After the gate pad GP and the source pad SP are formed, a film of, e.g., a polyimide resin is coated as a protective film over the substrate 1, exposed to light, and developed such that the portions of the polyimide resin film located on the gate pad GP and the source pad SP are removed, and openings are formed.

Subsequently, the surface of the substrate 1 is protected with a tape or the like. Thereafter, the back surface of the n⁺-type single-crystal silicon substrate 1A is ground with the protective surface directed downward. Then, as a conductive film, e.g., a Ti (titanium) film, a Ni (nickel) film, and a Au (gold) film are deposited in this order on the back surface of the n⁺-type single-crystal silicon substrate 1A by a sputtering method to form a laminate film. The laminate film forms the extraction electrode (drain electrode) of the drain (n⁺-type single-crystal silicon substrate 1A and the n⁻-type single-crystal silicon layer 1B).

Subsequently, the tape mentioned above is stripped, and bump electrodes made of, e.g., Au or the like are formed over the openings formed in the polyimide resin film mentioned above. After that, the substrate 1 in a wafer state is subjected to, e.g., dicing along post-division regions so as to be divided into individual chips CHP (see FIG. 13). Thereafter, each of the chips CHP is mounted on a leadframe (packaging board) having external terminals, and molded (packaged) with a resin or the like, whereby the semiconductor device according to the present first embodiment is manufactured.

As shown in FIG. 11, the semiconductor device comprising the power MISFET according to the present first embodiment has the p⁻-type semiconductor region 3 provided in the surface side of the n⁻-type single-crystal silicon layer 1B in the outer circumferential region B, the p⁻-type semiconductor region 8 provided in the surface side of the n⁻-type single-crystal silicon layer 1B on the outermost circumferential side of the outer circumferential region B in isolated relation to the p⁻-type semiconductor region 3, and the pattern FG formed of the conductive film 7 provided on the n⁻-type single-crystal silicon layer 1B in the outer circumferential region B with the insulating film 2 interposed therebetween.

In the present first embodiment, the pattern FG formed of the conductive film 7 electrically coupled to the gate electrodes 6 is provided to be extended to the outermost circumferential electrode terminal 18. In other words, the pattern FG is provided to be extended from the p⁻-type semiconductor region 3 to the p⁻-type semiconductor region 8.

The extended pattern FG allows a reduction in the resistance value of a gate pattern completely surrounding the chip CHP shown in FIG. 13 or the like.

In the impurity introduction step for forming the p⁻-type semiconductor regions 9 and in the impurity introduction step for forming the p⁺-type semiconductor regions 15, the pattern FG serves as a mask to successfully prevent impurity leakage in the n⁻-type single-crystal silicon layer 1B between the p⁻-type semiconductor region 3 and the p⁻-type semiconductor region 8.

By preventing the impurity leakage, it is possible to prevent the occurrence of an increased leakage current and an avalanche breakdown in the outer circumferential region B and further prevent a reduction in breakdown voltage. That is, it is possible to suppress the influence of ion implantation after the formation of the pattern FG. In other words, by applying the present invention, it is possible to improve the characteristics of the semiconductor device.

Figure 4:
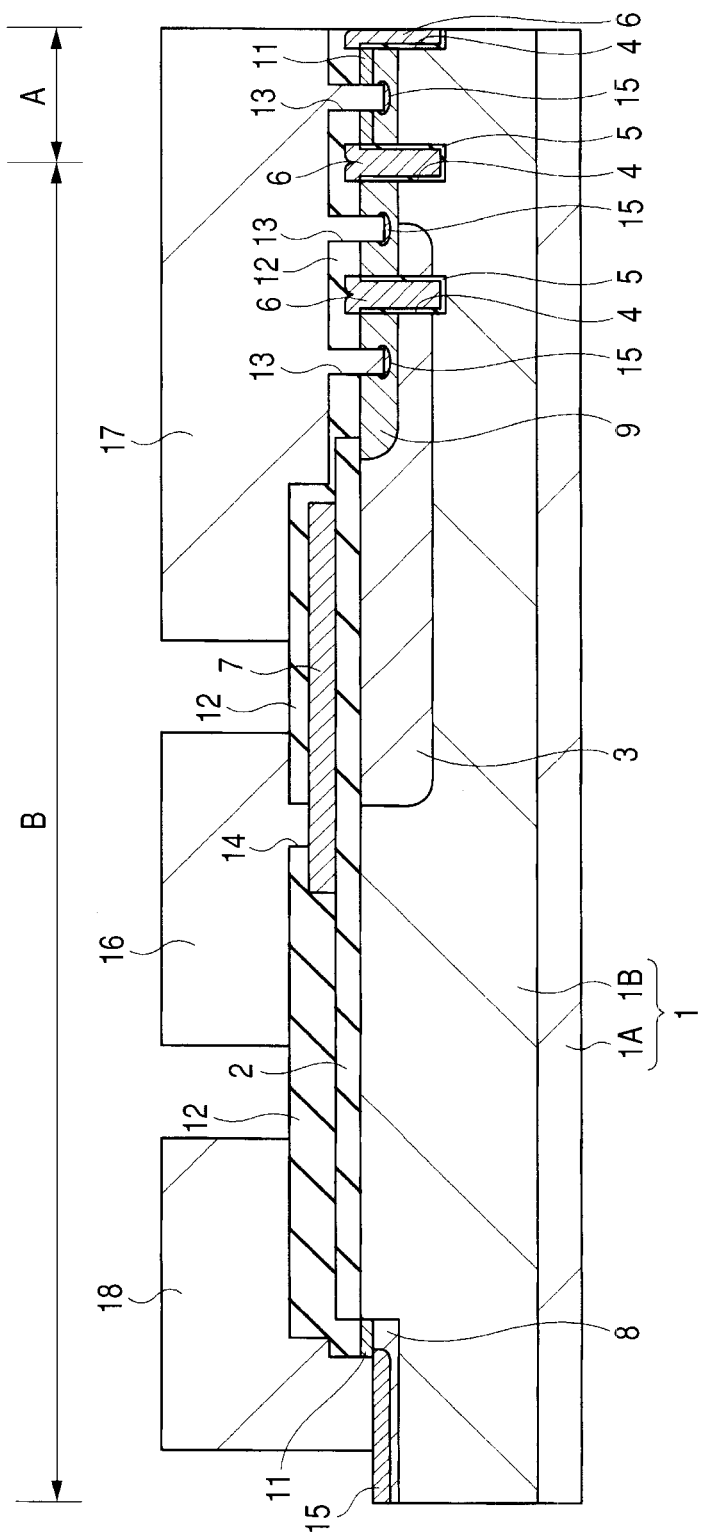
FIG. 4 is a cross-sectional view of the principal portion of the semiconductor device in the manufacturing process thereof, subsequent to FIG. 3.

By applying the present invention, it is also possible to reduce the manufacturing cost of the semiconductor device. In the foregoing semiconductor device (see FIG. 4) examined by the present inventors, the area of the conductive film 7 is minimized to reduce the gate-drain capacitance, while the area of the insulating film 2 over the substrate 1 (n⁻-type single-crystal silicon layer 1B) is increased to prevent the impurity leakage in the impurity introduction steps. As a result, two photomasks are needed to pattern the conductive film 7 and the insulating film 2 using a photolithographic technique. However, in the present invention, it is sufficient to use a single photomask for simultaneous patterning of the conductive film 7 and the insulating film 2 using a photolithographic technique, as described above with reference to FIG. 8. That is, the manufacturing cost of the semiconductor device can be reduced.

Figure 15:
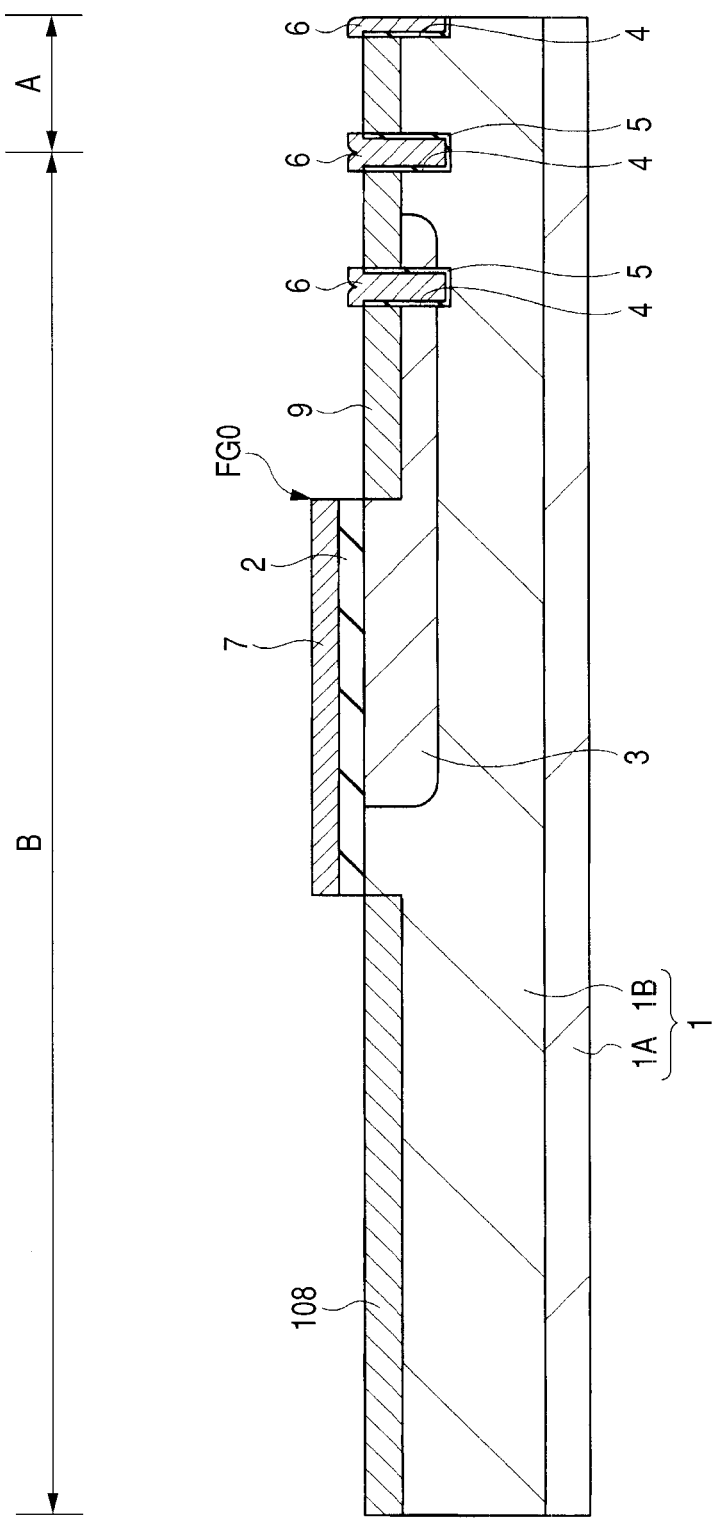
FIG. 15 is a cross-sectional view of the principal portion of the semiconductor device in the manufacturing process thereof, which has been examined by the present inventors.
Figure 16:
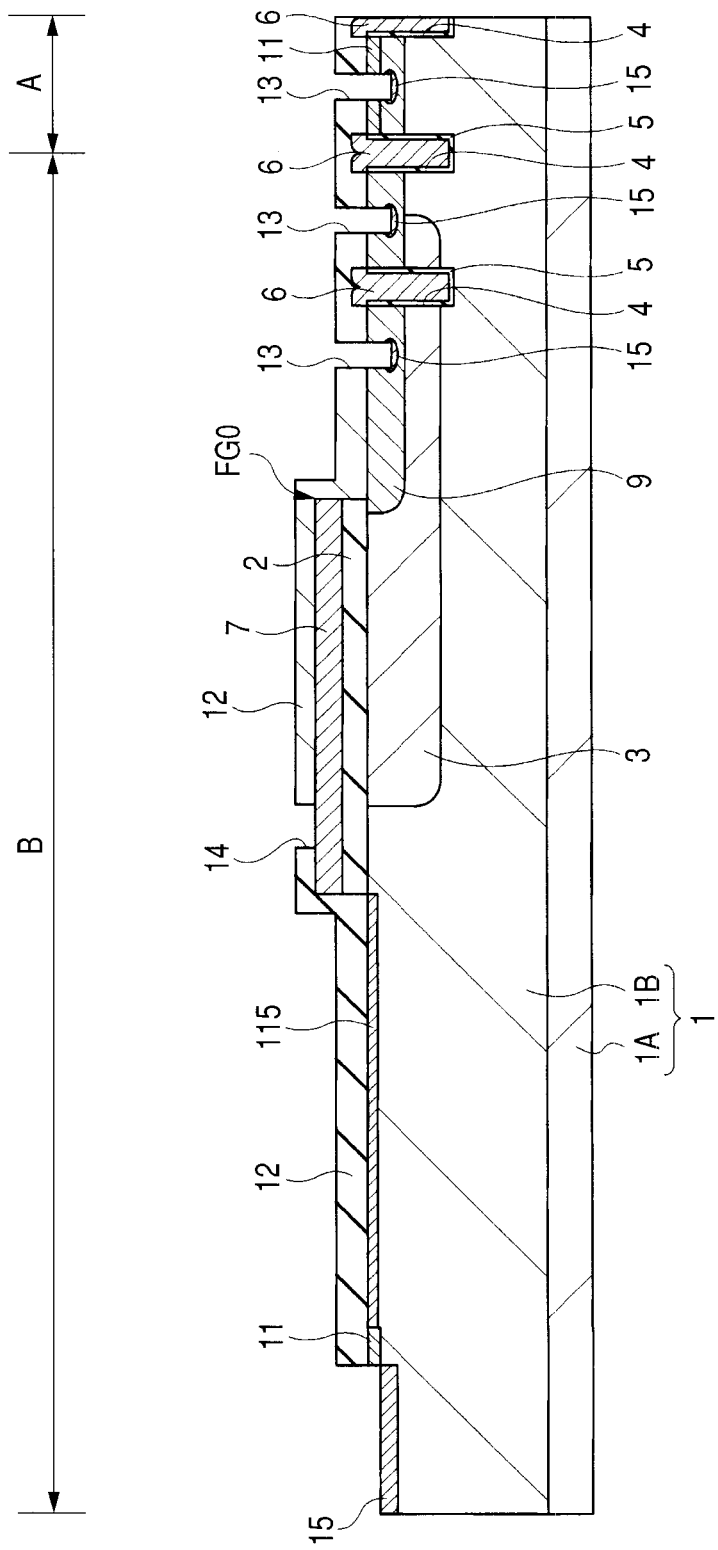
FIG. 16 is a cross-sectional view of the principal portion of the semiconductor device in the manufacturing process thereof, which has been examined by the present inventors.

Thus, in the present first embodiment, optimization is performed to prevent the impurity leakage and also reduce the manufacturing cost. FIGS. 15 and 16 are cross-sectional views each schematically showing the principal portion of the semiconductor device examined by the present inventors in the manufacturing process thereof.

As shown in FIG. 15, when an impurity is introduced into the entire surface of the substrate 1 to form the p⁻-type semiconductor regions 9 serving as the channel layer of the power MISFET, in the region where a pattern FG0 formed of the conductive film 7 is provided via the insulating film 2, the pattern mentioned above serves as a mask, so that the impurity mentioned above is not introduced therein. However, in the portion of the outer circumferential region B which is not covered with the pattern FG0, the impurity mentioned above leaks to form a leakage region 108 in the surface side of the n⁻-type single-crystal silicon layer 1B.

As shown in FIG. 16, when an impurity is introduced into the entire surface of the substrate 1 to form the p⁺-type semiconductor regions 15 serving as the back gate of the power MISFET, in the region where the pattern FG0 formed of the conductive film 7 is provided via the insulating film 2, the pattern FG0 serves as a mask, so that the impurity mentioned above is not introduced therein. However, in the portion of the outer circumferential region B which is not covered with the pattern FG0, only the insulating film 12 is too thin and insufficient so that the impurity mentioned above leaks to form a leakage region 115 in the surface side of the n⁻-type single-crystal silicon layer 1B.

Due to these leakage regions 108 and 115, an increase in leakage current or an avalanche breakdown may occur in the outer circumferential region B to further cause a reduction in breakdown voltage. With this being the case, the present first embodiment patterns the conductive film 7 and the insulating film 2 using the single photomask in order to reduce the manufacturing cost, and uses the pattern FG of the conductive film 7 via the insulating film 2 in order to prevent the impurity leakage.

(Embodiment 2)

The foregoing first embodiment has described the case where the pattern formed of the conductive film electrically coupled to the gate electrodes is provided to be extended to the outer circumferential electrode terminal in order to prevent the impurity leakage in the impurity introduction steps. The present second embodiment is different from the foregoing first embodiment in that the pattern is divided into three parts. Hereinbelow, a description will be given particularly of the difference.

Figure 17:
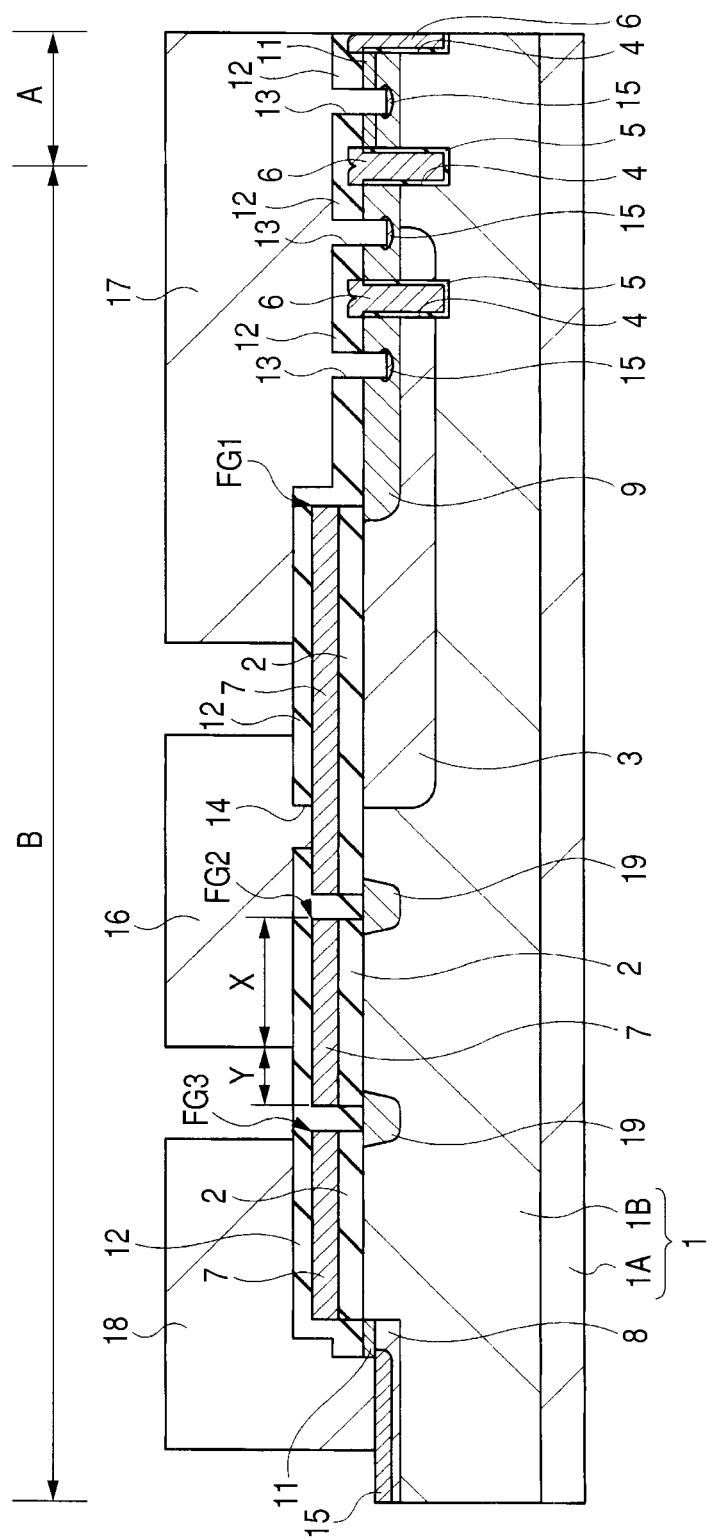
FIG. 17 is a cross-sectional view of a principal portion of a semiconductor device according to a second embodiment of the present invention in the manufacturing process thereof.
Figure 18:
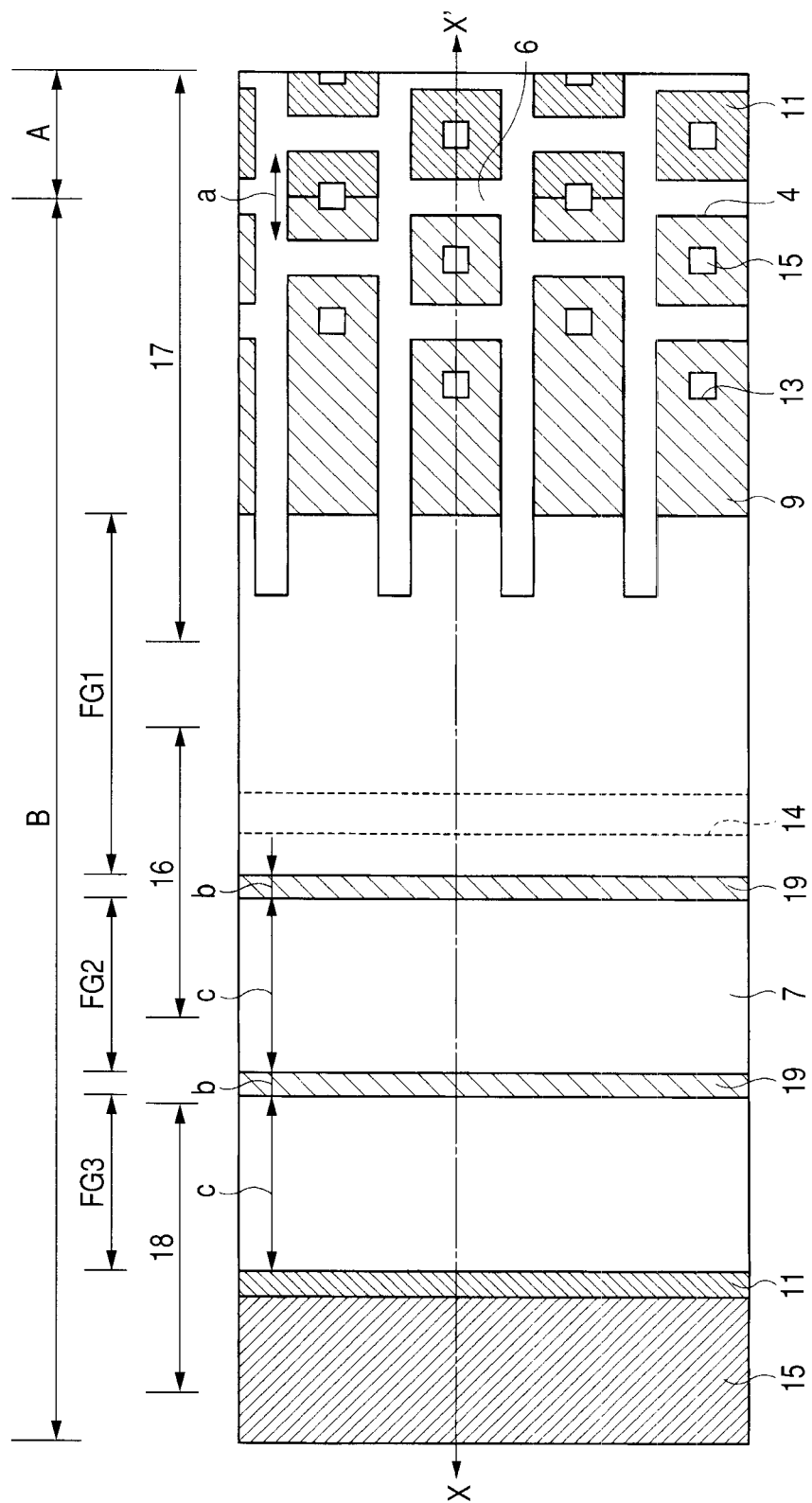
FIG. 18 is a plan view of the principal portion, which corresponds to FIG. 17.

A semiconductor device according to the present second embodiment has an n-channel trench-gate power MISFET. FIG. 17 is a cross-sectional view of a principal portion of the semiconductor device according to the present second embodiment. FIG. 18 is a plan view of the principal portion, which corresponds to FIG. 17. It is to be noted that FIG. 13 can be referenced for a chip CHP comprising the power MISEFT according to the present second embodiment. The cross section along the line X-X' in the drawing corresponds to the cross section shown in FIG. 18.

The semiconductor device according to the present second embodiment comprises the substrate 1 having the active region A where the power MISFET is provided and the outer circumferential region B which is located circumferentially outside the active region A and where a breakdown resistant structure is provided. The semiconductor device according to the present second embodiment also comprises three patterns (separate patterns) each formed of the conductive film 7 provided on the substrate 1 in the outer circumferential region B via the insulating film 2 and mutually separated from each other, i.e., a pattern FG1, a pattern FG2, and a pattern FG3. The semiconductor device according to the present second embodiment further comprises a metal film electrically coupled to the gate electrodes 6 and containing, as a main component, Al composing the gate electrode terminal 16 provided in a layer over the conductive film 7.

In the present second embodiment, the pattern FG (see FIG. 11) shown in the foregoing first embodiment is divided into the three patterns mutually separated from each other, i.e., the pattern FG1 (innermost circumferential pattern) on the innermost circumferential side, the pattern FG3 (outermost circumferential pattern) on the outermost circumferential side, and the pattern FG2 between the innermost circumferential pattern and the outermost circumferential pattern. The respective sizes of the pattern FG1, the pattern FG2, and the pattern FG3 in the left-to-right direction (the direction along the plane surface of the substrate 1) of FIG. 17 are, e.g., 29.5 μm, 10 μm, and 10 μm. The size of the outermost circumferential electrode terminal 18 is, e.g., 23 μm. The size of each of the contact trenches 14 is, e.g., 3 μm.

A description will be given herein of the relationship between the respective widths of the remaining portion and the removed portion in the patterns FG1, FG2, and FG3 (which may be simply described as the pattern FG) with reference to FIG. 18. In FIG. 18, the reference mark a denotes the spacing between the gates (gate electrodes 6), the reference mark b denotes the width of each of the removed portions in the pattern FG, and the reference mark c denotes the width of the remaining portion in the pattern FG2 or FG3. The width c of the remaining portion in the pattern FG2 or FG3 is preferably larger than the width b of the removed portion in the pattern FG. This is because, when the width b of the removed portion is larger, the effect of the control of ion implantation by the pattern FG is degraded.

More preferably, the width c of the remaining portion in the pattern FG2 or FG3 is not less than 5 μm in terms of the stability of the pattern or the like.

As shown in FIG. 18, the trench gates (gate electrodes 6) in the active region A are provided in a net-like pattern in plan view. Preferably, the width b of the removed portion in the pattern FG is larger than the gate-to-gate spacing (pitch) a in the net-like pattern. This is because, when the width b of the removed portion in the pattern FG is equal to or smaller than the gate-to-gate spacing a, a short-circuit is more likely to occur between the adjacent patterns FG.

In considering the foregoing, the relations given by Gate-to-Gate Spacing a<Width b of Removed Portion in Pattern FG<Width c of Remaining Portion in Pattern FG2 or FG3 are preferably established. In another example, when the remaining portion in the pattern FG has a given width or more (e.g., not less than 5 μm), a characteristic-related problem may not occur depending on implantation conditions or the like. In this case, the width b of the removed portion in the pattern FG may be equal to or more than the width c of the remaining portion.

The conductive film 7 of the pattern FG1 is electrically coupled to the gate electrode terminal 16. The conductive film 7 of each of the patterns FG2 and FG3 is electrically decoupled from the gate electrode terminal 16. As shown in FIGS. 17 and 18, the conductive film 7 is not provided either between the patterns FG1 and FG 2 or between the patterns FG2 and FG3. The patterns FG1, FG2, and FG3 can be formed by etching away the unneeded portions of the conductive film 7 and the conductive film 2 during patterning described with reference to FIG. 8 in the foregoing first embodiment.

As described above, a reduction in gate-drain capacitance leads to reductions in the feedback capacitance and input capacitance of the power MISFET. Accordingly, by preventing the formation of the conductive film 7 which forms the gate-drain capacitance, the gate-drain capacitance can be reduced. In the present second embodiment, by adopting the structure in which the patterns FG1, FG2, and FG3 are separated, it is possible to provide the improved characteristics by reducing the impurity leakage described above in the foregoing first embodiment, and reduce the gate-drain capacitance. The gate-drain capacitance in the semiconductor device (see FIG. 17) according to the present second embodiment can be reduced to a value about 20% lower than the gate-drain capacitance in the semiconductor device (see FIG. 11) according to the foregoing first embodiment and the gate-drain capacitance in the semiconductor device (see FIG. 4) examined by the present inventors.

The widthwise size of the gate electrode terminal 16 in the left-to-right direction of FIG. 17 is preferably set larger on the outermost circumferential side in order to reduce gate resistance. It may be considered to set the widthwise size of the gate electrode terminal 16 such that the width X of the overlapping portion between the pattern FG2 and the gate electrode terminal 16 is larger than the width Y of the non-overlapping portion therebetween. In the case where the potential of the pattern FG2 is not fixed, even when the widthwise size of the gate electrode terminal 16 is set larger, the influence of capacitance can be reduced because the influence of the fixed capacitance between the pattern FG2 and the gate electrode terminal 16 is small.

Accordingly, the potential of the pattern FG2 is preferably not fixed (not coupled to the ground potential or the power supply potential).

However, when the influence of a parasitic MISFET needs to be suppressed, the potential of the pattern FG2 may also be fixed to the ground potential or the like.

As for the potential of the pattern FG3, it is preferably fixed to the ground potential or the like, as will be described later in the fourth embodiment of the present invention.

Additionally, p⁻-type semiconductor regions 19 are provided in the surface side of the substrate 1 and between the patterns FG1 and FG2, as well as between the patterns FG2 and FG3. The p⁻-type semiconductor regions 19 can be formed with the impurity introduced in the step of forming the p⁻-type semiconductor regions 9 forming the channel layer that has been described with reference to FIG. 9 in the foregoing first embodiment.

(Embodiment 3)

The foregoing first embodiment has described the case where the single pattern FG formed of the conductive film electrically coupled to the gate electrodes is provided to be extended to the outer circumferential electrode terminal in order to prevent the impurity leakage in the impurity introduction steps. The foregoing second embodiment has described the case where the single pattern FG according to the foregoing first embodiment is divided into the three parts for the purpose of reducing the gate-drain capacitance. The present third embodiment will describe the case where the single pattern FG according to the foregoing first embodiment is divided into two parts.

Figure 19:
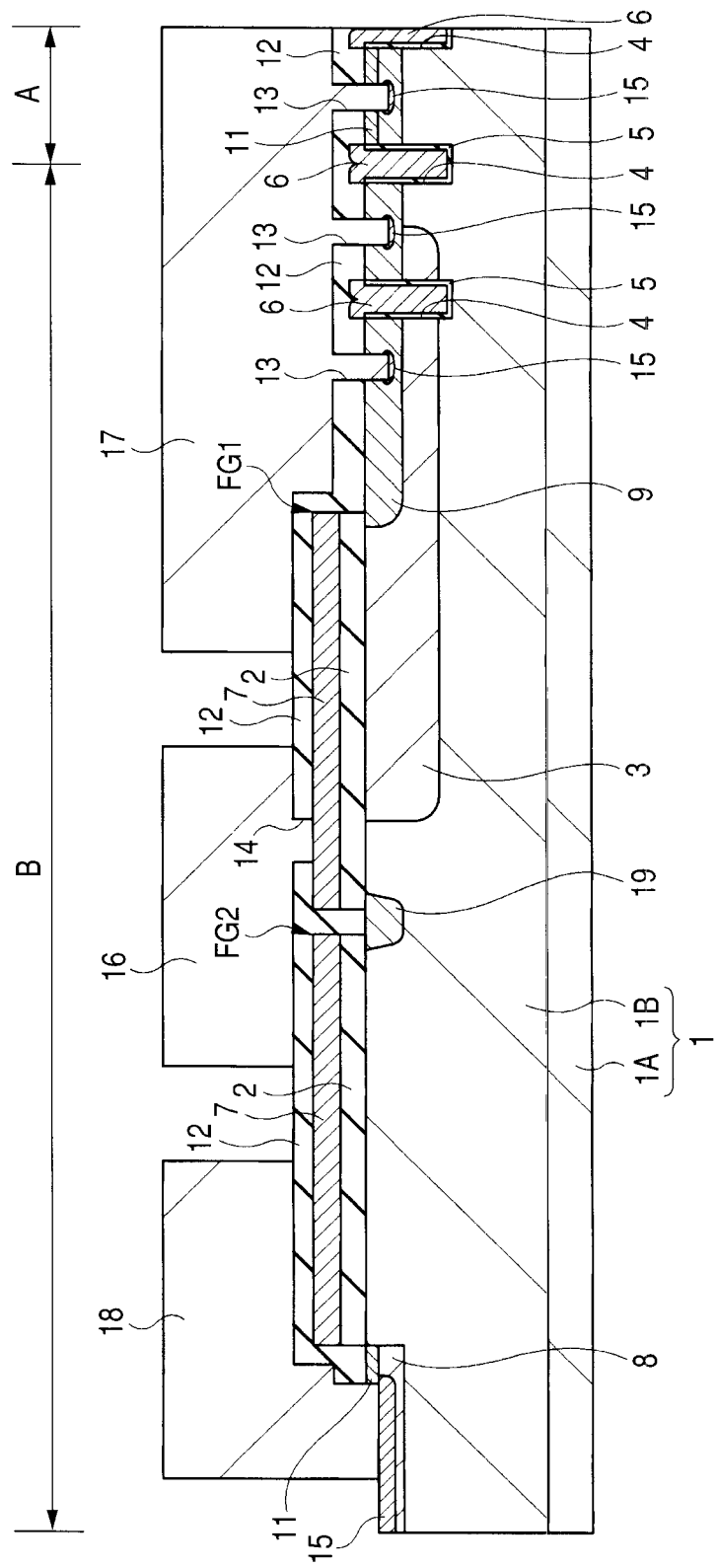
FIG. 19 is a cross-sectional view of a principal portion of a semiconductor device according to a third embodiment of the present invention in the manufacturing process thereof.
Figure 20:
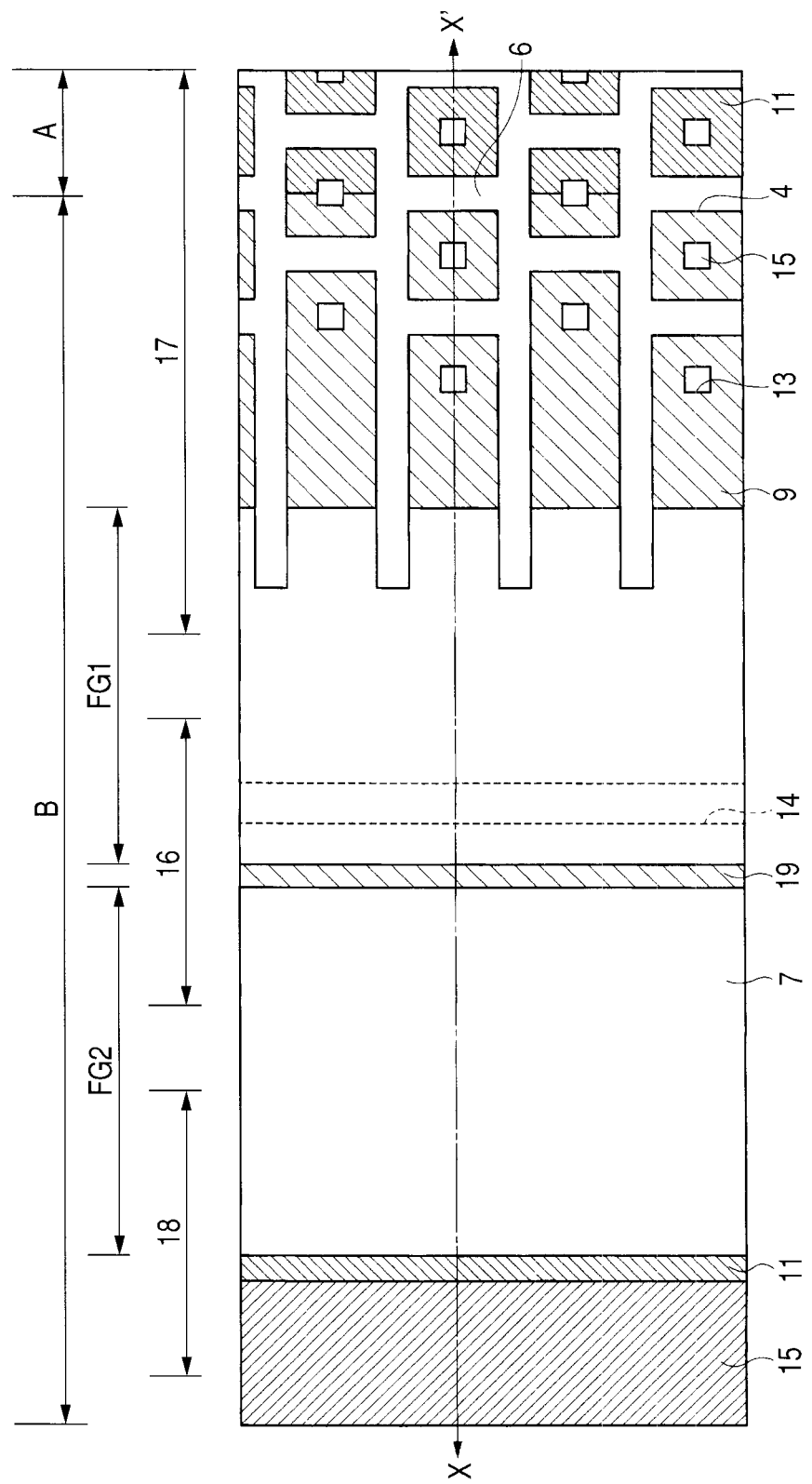
FIG. 20 is a plan view of the principal portion, which corresponds to FIG. 19.

A semiconductor device according to the present third embodiment has an n-channel trench-gate power MISFET. FIG. 19 is a cross-sectional view of a principal portion of the semiconductor device according to the present third embodiment. FIG. 20 is a plan view of the principal portion, which corresponds to FIG. 19. It is to be noted that FIG. 13 can be referenced for a chip CHP comprising the power MISEFT according to the present third embodiment. The cross section along the line X-X' in the drawing corresponds to the cross section shown in FIG. 19.

The semiconductor device according to the present third embodiment comprises the substrate 1 having the active region A where the power MISFET is provided and the outer circumferential region B which is located circumferentially outside the active region A and where the breakdown resistant structure is provided. The semiconductor device according to the present third embodiment also comprises two patterns (separate patterns) each formed of the conductive film 7 provided on the substrate 1 in the outer circumferential region B via the insulating film 2 and mutually separated from each other, i.e., a pattern FG1 and a pattern FG2. The semiconductor device according to the present third embodiment further comprises a metal film electrically coupled to the gate electrodes 6 and containing, as a main component, Al composing the gate electrode terminal 16 provided in a layer over the conductive film 7.

To provide optimum conditions in terms of preventing the impurity leakage in the impurity introduction steps and reducing the gate-drain capacitance, it is also possible to halve the pattern, as shown in the present third embodiment.

For the relations among the gate-to-gate spacing a, the width b of the removed portion in the pattern FG, and the width c of the remaining portion in the pattern FG2, the same holds true as in the foregoing second embodiment.

(Embodiment 4)

In the semiconductor device (see FIG. 17) shown in the foregoing second embodiment, a parasitic MISFET is formed on the outermost circumferential side of the outer circumferential region B. Specifically, the parasitic MISFET is formed which has the conductive film 7 of the outermost circumferential pattern FG3 as the gate, the insulating film 2 of the pattern FG3 as the gate insulating film, and the p⁻-type semiconductor region 8 and the p⁻-type semiconductor regions 19 each formed in the n⁻-type single-crystal silicon layer 1B as the source/drain.

Therefore, to prevent the operation of the parasitic MISFET, the semiconductor device comprising an n-channel trench-gate power MISFET according to the present fourth embodiment has the gate of the parasitic MISFET grounded to the substrate 1 such that the gate potential is equal to the drain potential of the power MISFET provided in the active region A. Specifically, the gate of the parasitic MISFET is grounded to the substrate 1 via a contact CNT.

Figure 21:
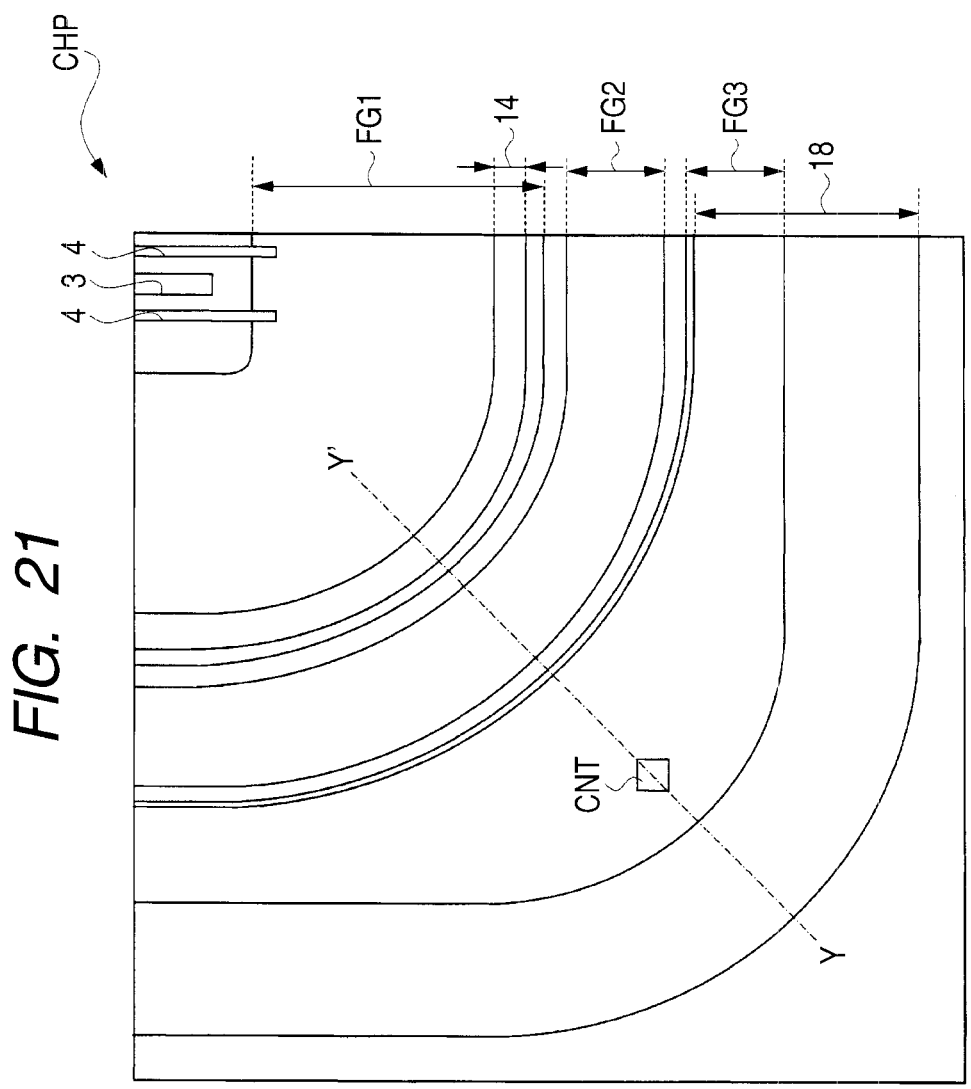
FIG. 21 is a plan view of a principal portion of a semiconductor device according to a fourth embodiment of the present invention.
Figure 22:
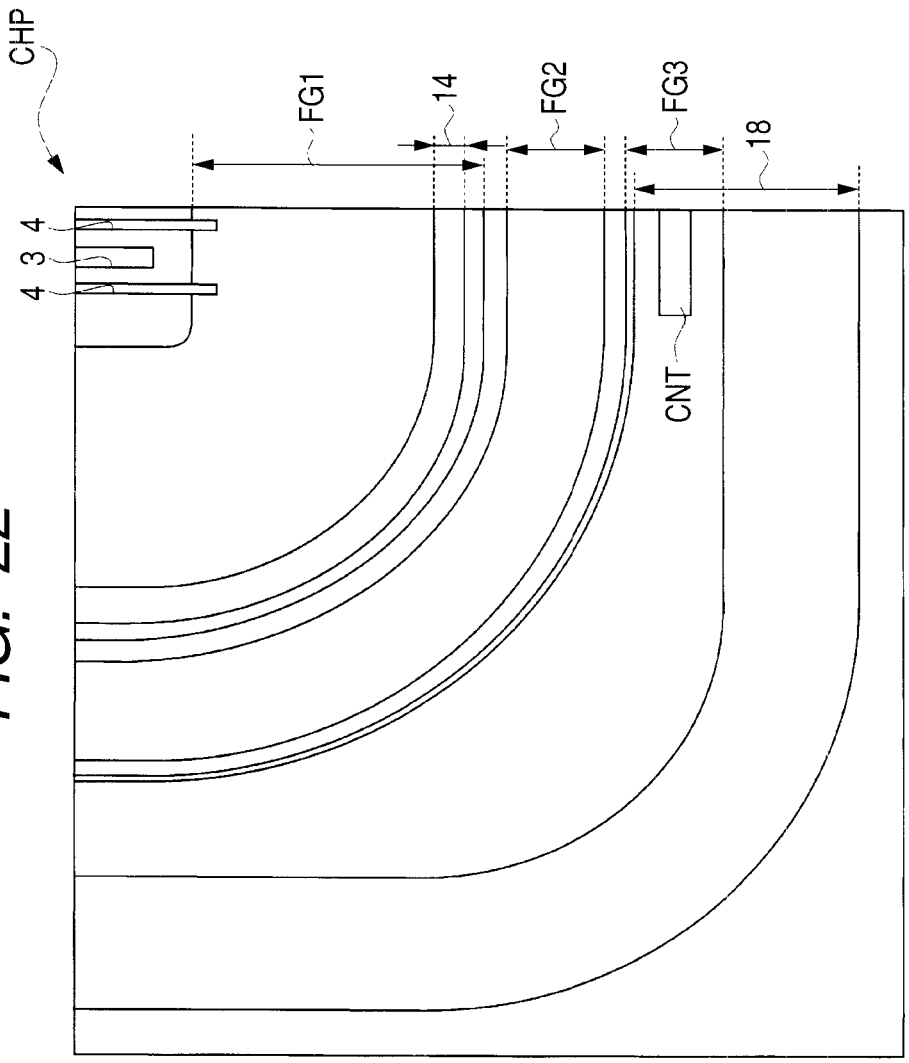
FIG. 22 is a plan view of the principal portion of the semiconductor device according to the fourth embodiment.
Figure 23:
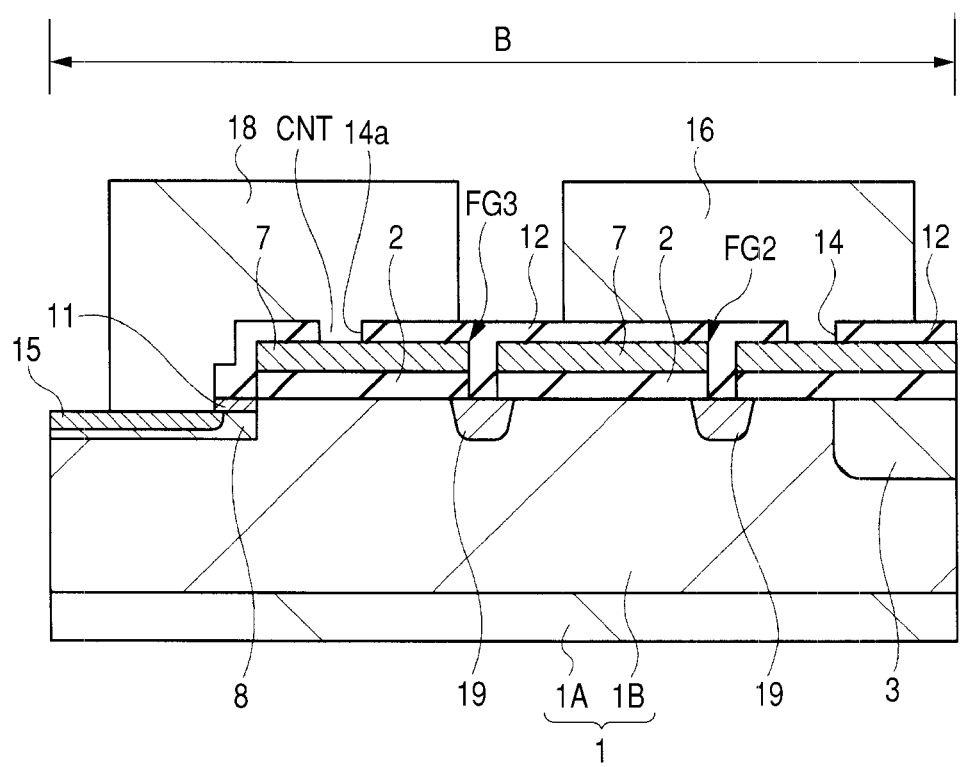
FIG. 23 is a cross-sectional view of the principal portion of the semiconductor device according to the fourth embodiment.

FIGS. 21 and 22 are plan views each showing a principal portion of the semiconductor device according to the present fourth embodiment. FIG. 21 shows the case where the contact CNT is provided at the corner portion of the chip CHP. FIG. 22 shows the case where the contact CNT is provided at the edge portion of the chip CHP. It is to be noted that FIG. 13 can be referenced for the chip CHP comprising the power MISEFT according to the present fourth embodiment. The region surrounded by the broken line corresponds to the region shown in each of FIGS. 21 and 22. FIG. 23 is a cross-sectional view of the principal portion of the semiconductor device according to the present fourth embodiment, which shows the cross section along the line Y-Y' of FIG. 21.

As shown in FIG. 23, the outermost circumferential electrode terminal 18 is electrically coupled to the substrate 1. Over the conductive film 7 of the outermost circumferential pattern FG3, the contact CNT is provided. The contact CNT is formed by burying the metal film, which is the same as the material of the outermost circumferential electrode terminal 18, in a contact trench 14a opened in the insulating film 12. Electrical coupling is provided by the outermost circumferential electrode terminal 18 formed of the metal film of Al (aluminum) or the like and metal wiring formed of Al or the like and connected to the conductive film of the outermost circumferential pattern FG3 via the contact CNT. That is, the conductive film 7 of the outermost circumferential pattern FG3 serving as the gate of the parasitic MISFET has the same potential as that of the substrate 1.

Although the description has been given thus far to the case where the contact CNT is provided at one of the corner portions (see FIG. 21) of the chip CHP, the contact CNT may be provided at each of the corner portions of the chip CHP. Likewise, the contact CNT may also be provided at each of the edge portions (see FIG. 22). When the contact CNT is provided at the corner portion, the external electrode terminal 18 and the pattern FG2 occupy a larger area at the corner portion than when the contact CNT is provided at the edge portion. Accordingly, a larger margin can be reserved for alignment. It is sufficient to provide one or more contacts CNT at the corner portion or edge portion of the chip CHP.

In the semiconductor device according to the present fourth embodiment, the conductive film 7 of the innermost circumferential pattern FG1 provided on the innermost circumferential side of the outer circumferential region B is electrically coupled to the gate electrodes 6 of the power MISFET. In addition, the conductive film 7 of the outermost circumferential pattern FG3 provided on the outermost circumferential side of the outer circumferential region B is electrically connected to the substrate 1 via the contact CNT. Moreover, the conductive film 7 of the pattern FG2 other than that of the innermost circumferential pattern and that of the outermost circumferential pattern is floating.

The contact CNT is formed by, e.g., forming the contact trench 14a in the insulating film 12 over the conductive film 7 composing the outermost circumferential pattern FG3 in the same step as the step of forming the contact trench 14, and burying the metal film in the contact trench 14a in the same step as the step of forming the metal film composing the outermost circumferential electrode terminal 18.

By thus setting the gate of the parasitic MISFET formed on the outermost circumferential side to the same potential as that of the substrate 1 via the contact CNT and the outermost circumferential electrode terminal 18, the operation of the parasitic MISFET can be prevented.

(Embodiment 5)

In the semiconductor device shown in the foregoing fourth embodiment, the pattern FG2 between the pattern FG1 composing the innermost circumferential pattern and the pattern FG3 composing the outermost circumferential pattern is the floating pattern which is not electrically coupled to the gate electrode 6 of the power MISEFT, the substrate 1, or the like.

Figure 24:
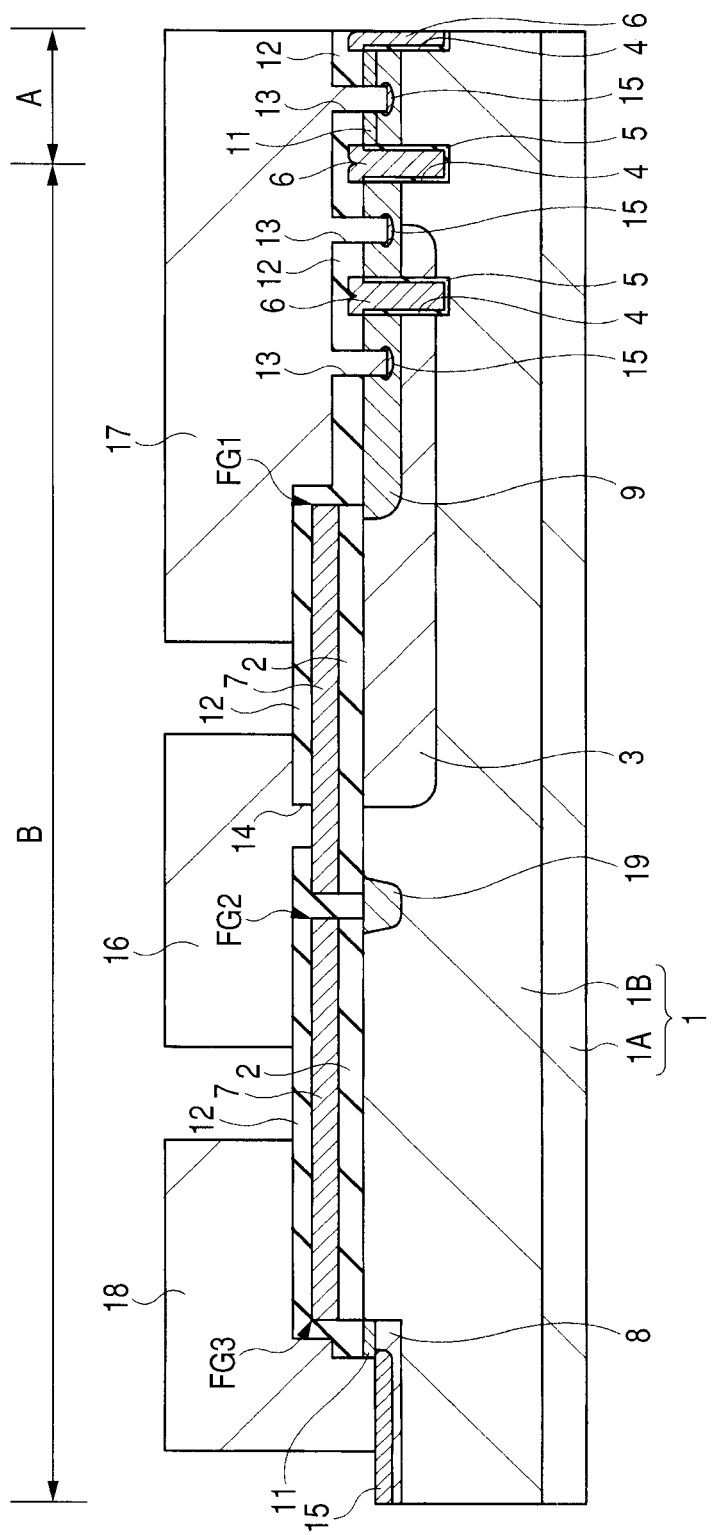
FIG. 24 is a cross-sectional view of a principal portion of a semiconductor device according to a fifth embodiment of the present invention.
Figure 25:
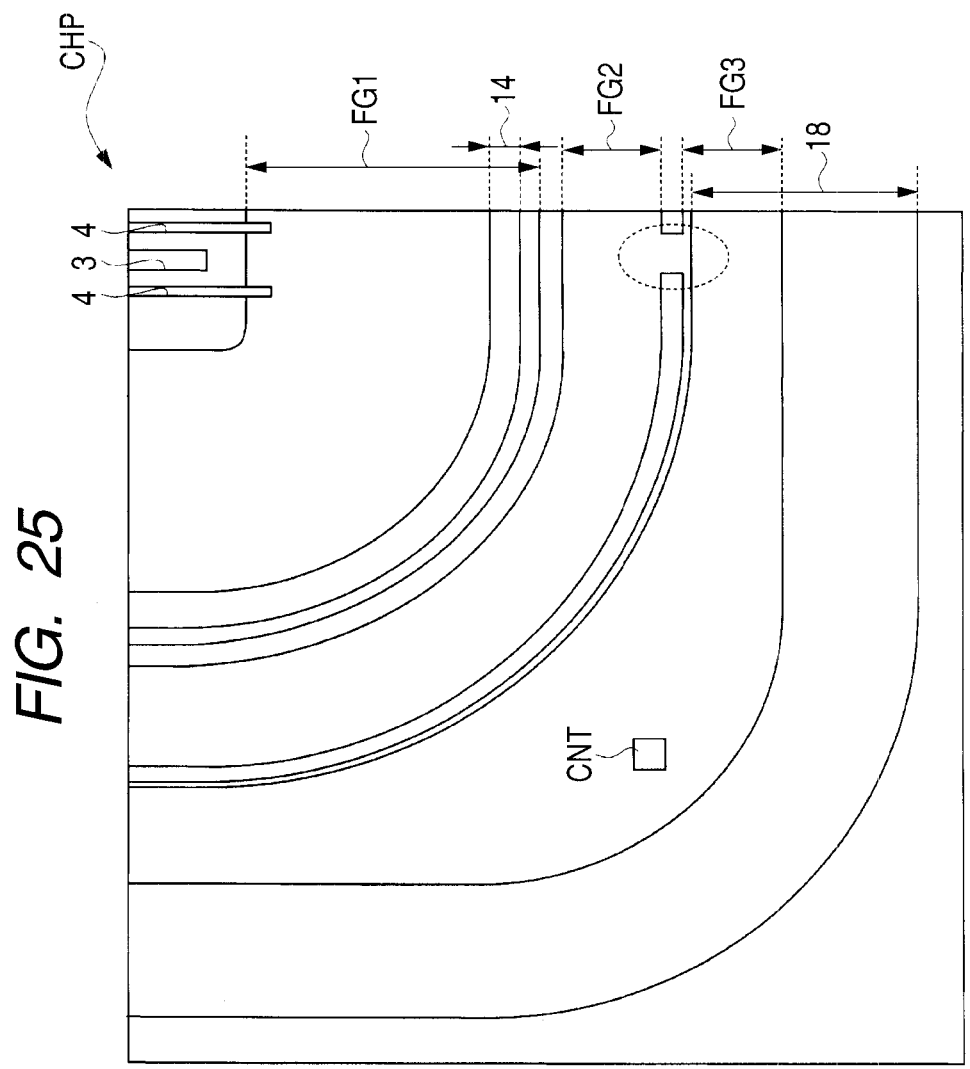
FIG. 25 is a plan view of the principal portion of the semiconductor device according to the fifth embodiment.

Therefore, to prevent the influence of the floating, a semiconductor device comprising an n-channel trench-gate power MISFET according to the present fifth embodiment has the conductive film 7 of the pattern FG2, which is the floating pattern, grounded to the substrate 1, in the same manner as the conductive film 7 of the outermost circumferential pattern FG3 is grounded to the substrate 1, such that the potential of the conductive film 7 of the pattern FG2 is equal to the drain potential of the power MISFET provided in the active region A. FIG. 24 shows a cross-sectional view of a principal portion of the semiconductor device according to the present fifth embodiment. FIG. 25 shows a plan view of the principal portion of the semiconductor device according to the present fifth embodiment. The cross section of the portion surrounded by the broken line of FIG. 25 is shown in FIG. 24.

Of the patterns FG1, FG2, and FG3 mutually separated from each other shown in FIG. 21, the pattern FG3 composing the outermost circumferential pattern and the pattern FG2 composing the floating pattern are partially coupled, as shown in FIGS. 24 and 25.

These patterns can be formed by, e.g., removing the unneeded portions of the conductive film 7 and the insulating film 2 by etching such that the pattern FG3 composing the outermost circumferential pattern and the pattern FG2 composing the floating pattern are connected during patterning described with reference to FIG. 8 in the foregoing first embodiment.

By thus setting the conductive film 7 of the floating pattern to the same potential as that of the substrate 1 via the contact CNT and the outermost circumferential electrode terminal 18, the operation of the parasitic MISFET can be prevented.

9Embodiment 6)

Figure 26:
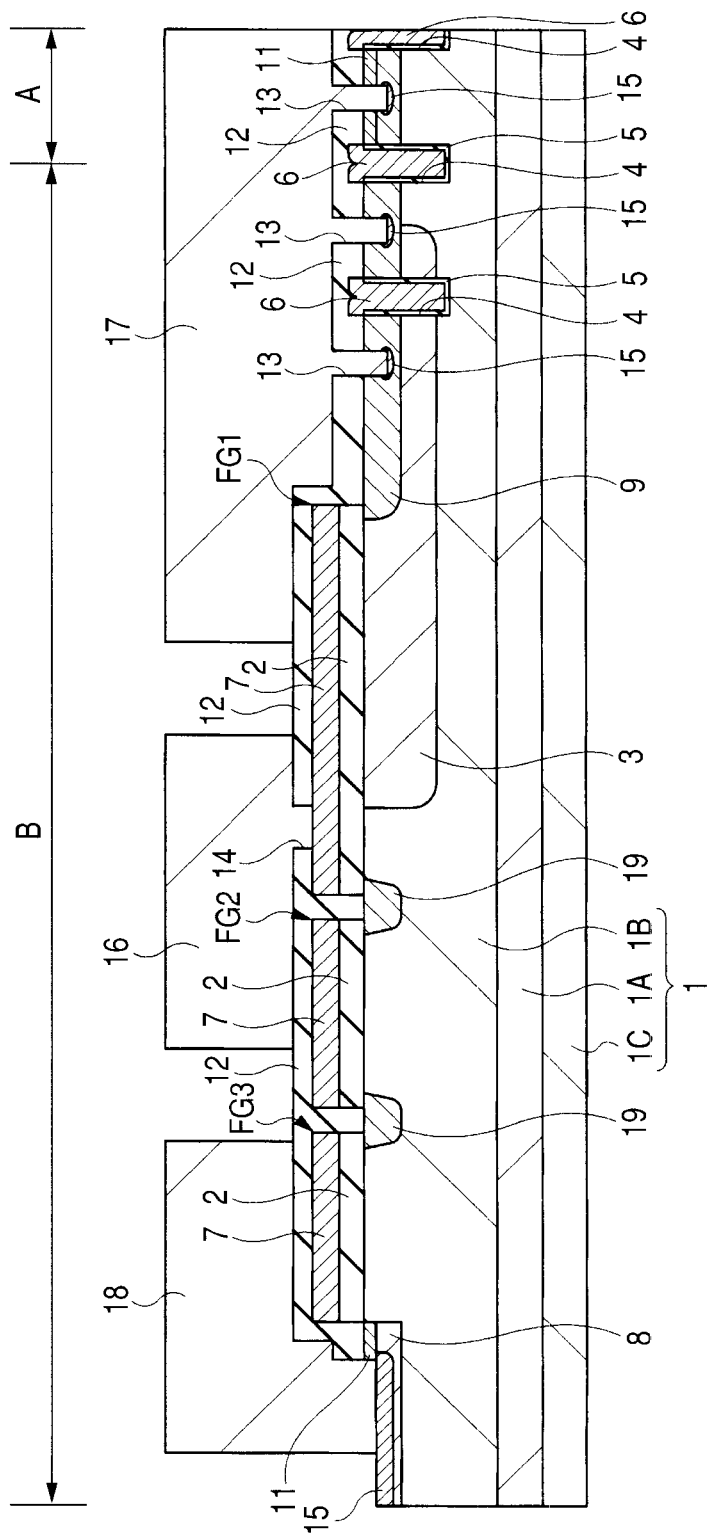
FIG. 26 is a plan view of a principal portion of a semiconductor device according to a sixth embodiment of the present invention.
Figure 27:
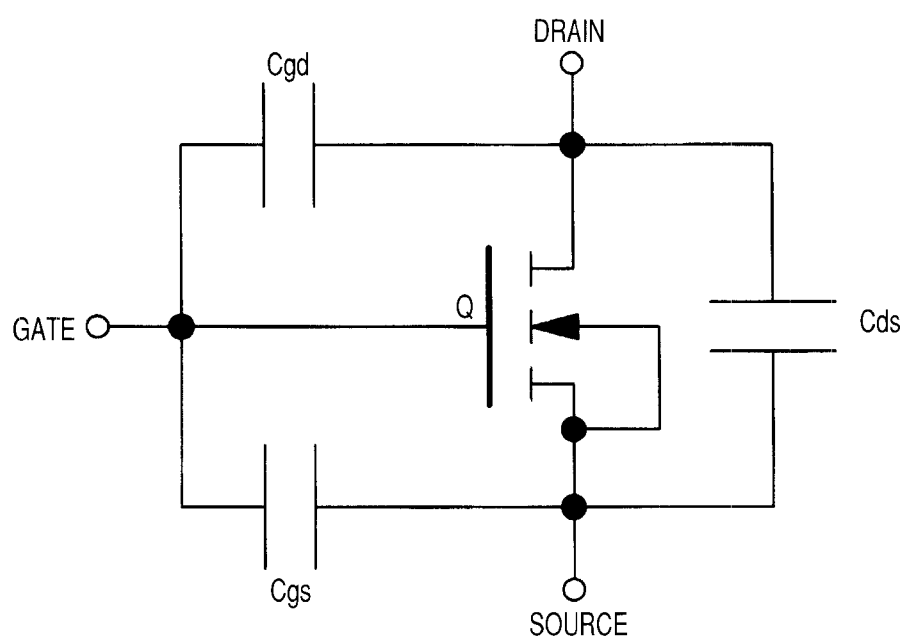
FIG. 27 is an equivalent circuit diagram for illustrating the feedback capacitance and input capacitance of a power MISFET.

Although each of the foregoing first to fifth embodiments has described the case where the power MISFET is used as the semiconductor element, the present sixth embodiment will describe the case where an IGBT is used as the semiconductor element. FIG. 26 shows a cross-sectional view of a principal portion of a semiconductor device comprising the IGBT.

As shown in FIG. 26, the semiconductor device comprising the IGBT according to the present sixth embodiment is different from the semiconductor device (see FIG. 17) comprising the power MISFET according to the foregoing second embodiment in that a $p^+$-type single-crystal silicon layer 1C is provided additionally on the back surface of the $n^+$-type single-crystal silicon substrate 1A. Thus, the IGBT has basically the same structure as the power MISFET, in which the collector region corresponds to the drain region as the drift region of the power MISFET, and the emitter region corresponds to the source region thereof.

The IGBT is applied to, e.g., a switching device which needs a breakdown voltage of the same order as or more than that of the power MISFET. Therefore, in the outer circumferential region B which is located circumferentially outside the active region A where the IGBT is provided, and where a breakdown resistant structure is provided, preventing impurity leakage and stabilizing the breakdown voltage by applying the present invention is important in terms of improving the characteristics of the IGBT.

Although the invention achieved by the present inventors has thus been described specifically based on the embodiments thereof, the present invention is not limited thereto. It will be easily appreciated that various modifications can be made in the invention without departing from the gist thereof.

For example, although each of the foregoing first to fifth embodiments has described the case where the present invention is applied to the n-channel trench-gate power MISFET, the present invention is also applicable to a p-channel MISFET in which each of the members composting the re-channel MISFET has the opposite conductivity type.

Also for example, although each of the foregoing second and third embodiments has described the case where the pattern of the conductive film provided over the substrate in the outer circumferential region with the insulating film interposed therebetween is divided into the two or three parts, the present invention is also applicable to the case where the pattern of the conductive film is divided into four or more parts.

Also for example, although each of the foregoing first to sixth embodiments has described the case where the silicon substrate is used as the semiconductor substrate, the present invention is also applicable to a gallium arsenide substrate or a silicon carbide substrate.

The present invention is effective with a semiconductor device, especially a semiconductor device comprising a power semiconductor element, and is widely used in the manufacturing industry of a semiconductor device particularly comprising a power MISFET.

What is claimed is:

1. A manufacturing method of a semiconductor device, the manufacturing method comprising the steps of:
   (a) forming, over a principal surface of a semiconductor substrate having a first region where a semiconductor element is provided and a second region which is located circumferentially outside the first region and where a breakdown resistant structure is provided, a first semiconductor region of a first conductivity type forming a drift region of the semiconductor element;
   (b) forming, in a surface side of the first semiconductor region in the second region, a second semiconductor region of a second conductivity type opposite to the first conductivity type;
   (c) forming, in the surface side of the first semiconductor region on an outermost circumferential side of the second region, a third semiconductor region of the first conductivity type or the second conductivity type in isolated relation to the second semiconductor region and surrounding the first region in plan view;
   (d) forming an insulating film over the semiconductor substrate;
   (e) forming a conductive film over the insulating film;
   (f) patterning the conductive film and the insulating film to form a pattern for exposing a predetermined portion of the first semiconductor region in the first region, and a predetermined portion of the first semiconductor region in the second region; and
   (g) after the step (f), introducing an impurity of the second conductivity type into the principal surface of the semiconductor substrate to form a fourth semiconductor region,
   wherein the semiconductor element has trench gates for controlling a current in the drift region, the manufacturing method further comprising the steps of:
   (h) between the step (d) and the step (e), forming a plurality of trenches in the surface side of the first semiconductor region in the first region;
   (i) after the step (h), forming a gate insulating film of the semiconductor element in each of the trenches;
   (j) in the step (f), forming the trench gates by burying the conductive film in each of the trenches and over the gate insulating film, the conductive film being coupled to at least one of the trench gates; and
   (k) forming a circumferential electrode terminal disposed over the insulating film and electrically coupled to the third semiconductor region, the circumferential electrode terminal surrounding the first region in plan view,
   wherein the circumferential electrode terminal partially overlaps with the conductive film in plan view.

2. A manufacturing method of a semiconductor device according to claim 1, the manufacturing method further comprising the steps of:
   (l) introducing an impurity of the first conductivity type into a surface of the fourth semiconductor region in the first region to form a fifth semiconductor region;
   (m) forming shallow trenches shallower than the trenches in a surface side of the fourth semiconductor region such that the shallow trenches are provided between the trench gates adjacent to each other so as to extend through the fifth semiconductor region; and (n) after the step (m), introducing an impurity of the second conductivity type into the principal surface of the semiconductor substrate to form a sixth semiconductor region of the second conductivity type such that the sixth semiconductor region covers a bottom portion of each of the shallow trenches within the fourth semiconductor region.

* * * * *